US012707707B2

(12) United States Patent
Nakamura et al.

(10) Patent No.: US 12,707,707 B2
(45) **Date of Patent: *Aug. 11, 2026**

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kazutoshi Nakamura, Nonoichi Ishikawa (JP); Shunta Murai, Kanazawa Ishikawa (JP); Daiki Yoshikawa, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 426 days.

This patent is subject to a terminal disclaimer.

(21) Appl. No.: 18/463,138

(22) Filed: Sep. 7, 2023

(65) Prior Publication Data

US 2024/0321869 A1 Sep. 26, 2024

(30) Foreign Application Priority Data

Mar. 23, 2023 (JP) ................................ 2023-046923

(51) Int. Cl.
*H10D 84/60* (2025.01)
*H10D 8/00* (2025.01)
(Continued)

(52) U.S. Cl.
CPC ........... *H10D 84/617* (2025.01); *H10D 8/422* (2025.01); *H10D 12/481* (2025.01); *H10D 62/127* (2025.01)

(58) Field of Classification Search
CPC .... H10D 8/422; H10D 12/481; H10D 62/127; H10D 62/157; H10D 62/393; H10D 84/617
See application file for complete search history.

(56) References Cited

U.S. PATENT DOCUMENTS 10,256,234 B2 4/2019 Tanabe et al.
2020/0135717 A1 4/2020 Takahashi et al.
(Continued)

FOREIGN PATENT DOCUMENTS

JP 6384425 B2 9/2018
JP 2020072137 A 5/2020
(Continued)

OTHER PUBLICATIONS

Notice of Reasons for Refusal (Office Action) mailed Feb. 18, 2026 in corresponding Japanese Application No. 2023-046923, with English machine translation, 10 pages.

*Primary Examiner* — Fazli Erdem
(74) *Attorney, Agent, or Firm* — Kim & Stewart LLP

(57) ABSTRACT

According to one embodiment, a semiconductor device includes a first electrode, a second electrode, a first region, and a second region. The second electrode is separated from the first electrode. The first region includes a first semiconductor region of a first conductivity type, a second semiconductor region of a second conductivity type, a third semiconductor region of the first conductivity type, a gate electrode, a fourth semiconductor region of the second conductivity type, a fifth semiconductor region of the first conductivity type, and a sixth semiconductor region of the first conductivity type. The fifth semiconductor region, located between the fourth semiconductor region and a portion of the third semiconductor region, has a higher first-conductivity-type impurity concentration than the third semiconductor region. The sixth semiconductor region, located between the third semiconductor region and the portion of the second electrode, has a higher first-conductivity-type impurity concentration than the third semiconductor region.

20 Claims, 18 Drawing Sheets

(51) Int. Cl.

| | |
|---|---|
| ***H10D 12/00*** | (2025.01) |
| ***H10D 62/10*** | (2025.01) |

(56) References Cited

U.S. PATENT DOCUMENTS

| | | | | |
|---|---|---|---|---|
| 2021/0376167 | A1 | 12/2021 | Soneda et al. | |
| 2022/0013645 | A1 | 1/2022 | Shimosawa et al. | |
| 2022/0037514 | A1 | 2/2022 | Harada et al. | |
| 2022/0102341 | A1 | 3/2022 | Kudo et al. | |
| 2022/0149191 | A1 | 5/2022 | Shirakawa et al. | |
| 2023/0036039 | A1 | 2/2023 | Matsui et al. | |
| 2024/0290781 | A1* | 8/2024 | Kato | H10D 84/617 |
| 2024/0321963 | A1* | 9/2024 | Murai | H10D 12/481 |
| 2024/0322020 | A1* | 9/2024 | Yoshikawa | H10D 62/127 |

FOREIGN PATENT DOCUMENTS

| | | | |
|---|---|---|---|
| JP | 2021-190496 | A | 12/2021 |
| JP | 2022016842 | A | 1/2022 |
| JP | 2022025674 | A | 2/2022 |
| JP | 2022-056498 | A | 4/2022 |
| JP | 2023019322 | A | 2/2023 |
| WO | 2021145080 | A1 | 7/2021 |

* cited by examiner

SEMICONDUCTOR DEVICE

CROSS-REFERENCE TO RELATED APPLICATIONS

This application is based upon and claims the benefit of priority from Japanese Patent Application No. 2023-046923, filed on Mar. 23, 2023; the entire contents of which are incorporated herein by reference.

FIELD

Embodiments of the invention generally relate to a semiconductor device.

BACKGROUND

Semiconductor devices used in power conversion and the like include reverse conducting insulated gate bipolar transistors (RC-IGBTs) in which a diode is embedded in an insulated gate bipolar transistor (IGBT). Technology is desirable in which the diode of such a semiconductor device can operate faster.

DETAILED DESCRIPTION

Figure 1:
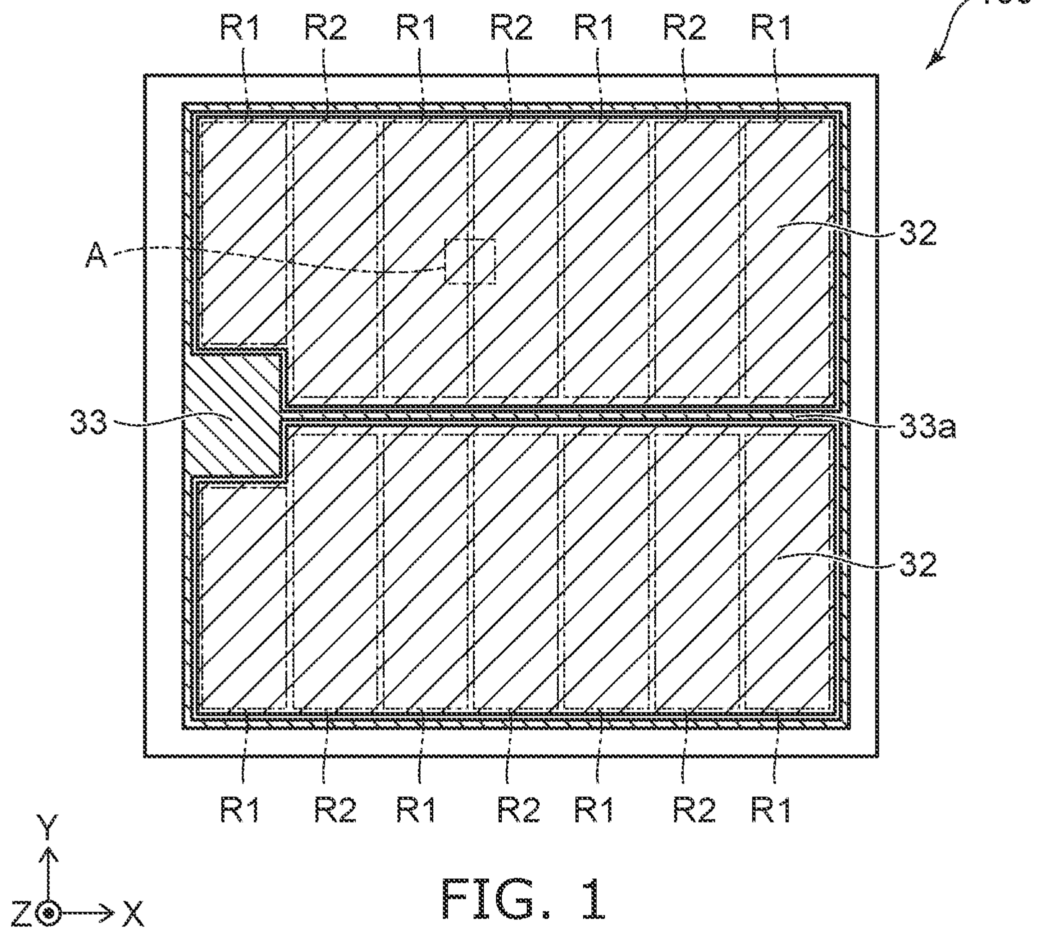
FIG. 1 is a plan view of a semiconductor device according to a first embodiment.

According to one embodiment, a semiconductor device includes a first electrode, a second electrode, a first region, and a second region. The second electrode is separated from the first electrode. The first region is located on a portion of the first electrode and positioned between the first electrode and the second electrode. The first region includes a first semiconductor region of a first conductivity type, a second semiconductor region of a second conductivity type, a third semiconductor region of the first conductivity type, a gate electrode, a fourth semiconductor region of the second conductivity type, a fifth semiconductor region of the first conductivity type, and a sixth semiconductor region of the first conductivity type. A portion of the second semiconductor region is located on the first semiconductor region. The third semiconductor region is located on the portion of the second semiconductor region. The gate electrode faces the third semiconductor region via a gate insulating layer in a second direction perpendicular to a first direction that is from the first electrode toward the second electrode. The fourth semiconductor region is located on the third semiconductor region and arranged with a portion of the second electrode in the second direction. The fifth semiconductor region is located between the fourth semiconductor region and a portion of the third semiconductor region in a third direction perpendicular to the first and second directions. The fifth semiconductor region is arranged with the portion of the second electrode in the second direction. The fifth semiconductor region has a higher first-conductivity-type impurity concentration than the third semiconductor region. The sixth semiconductor region is located between the third semiconductor region and the portion of the second electrode. The sixth semiconductor region has a higher first-conductivity-type impurity concentration than the third semiconductor region. The second region is located on an other portion of the first electrode and positioned between the first electrode and the second electrode. The second region includes a seventh semiconductor region of the second conductivity type, an other portion of the second semiconductor region, and an eighth semiconductor region of the first conductivity type. The seventh semiconductor region has a higher second-conductivity-type impurity concentration than the second semiconductor region. The other portion of the second semiconductor region is located on the seventh semiconductor region. The eighth semiconductor region is located on the other portion of the second semiconductor region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following description, the notations "$n^+$", "n" and "$n^-$" and the notations "$p^+$", "p" and "$p^-$" represent the relative levels of impurity concentrations of the conductivity types. Specifically, the notation "$n^+$" indicates that the n-type impurity concentration is relatively higher than the notation "n", and the notation "$n^-$" indicates that the n-type impurity concentration is relatively lower than the notation "n". The notation "$p^+$" indicates that the p-type impurity concentration is relatively higher than the notation "p", and the notation "$p^-$" indicates that the p-type impurity concentration is relatively lower than the notation "p".

The embodiments described below may be carried out with the p-type and the n-type of the semiconductor regions inverted.

First Embodiment

Figure 2:
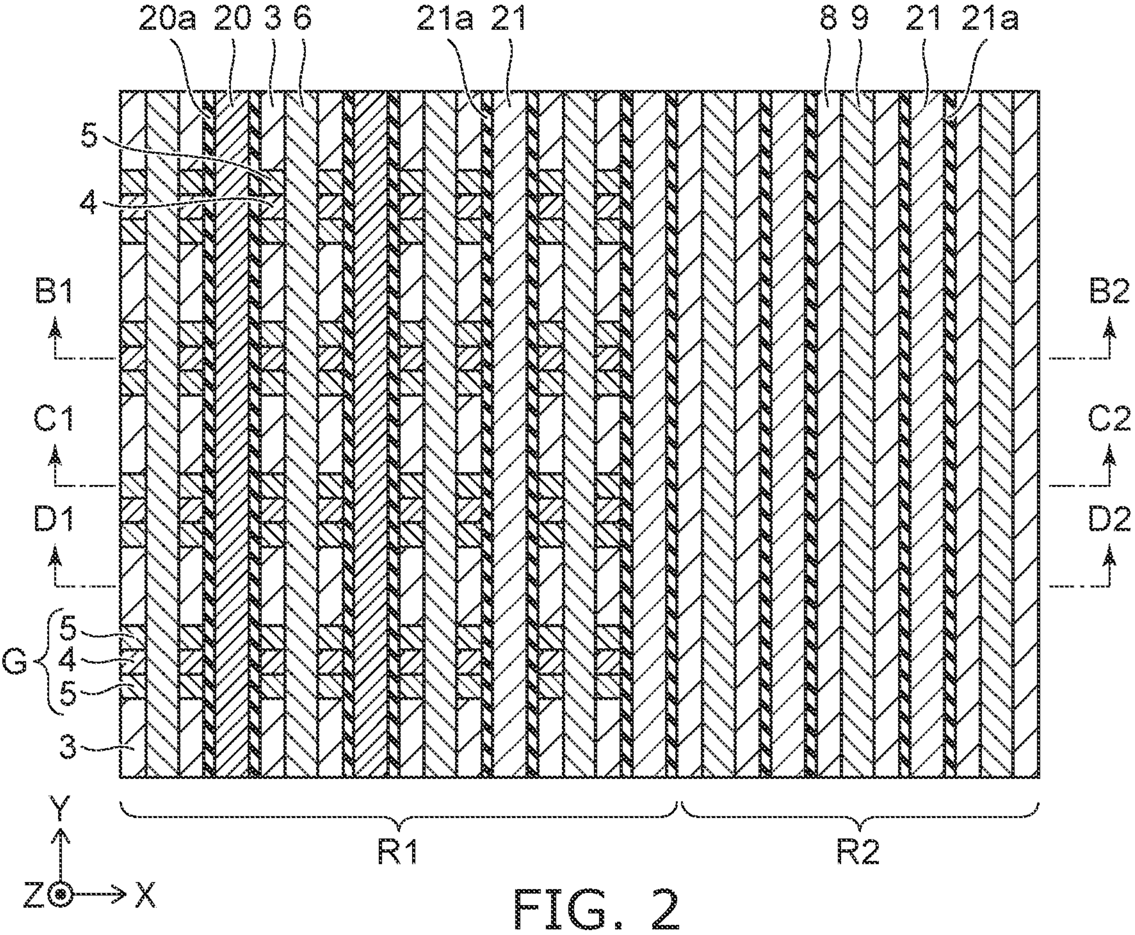
FIG. 2 is an enlarged plan view of portion A of FIG. 1.
Figure 3:
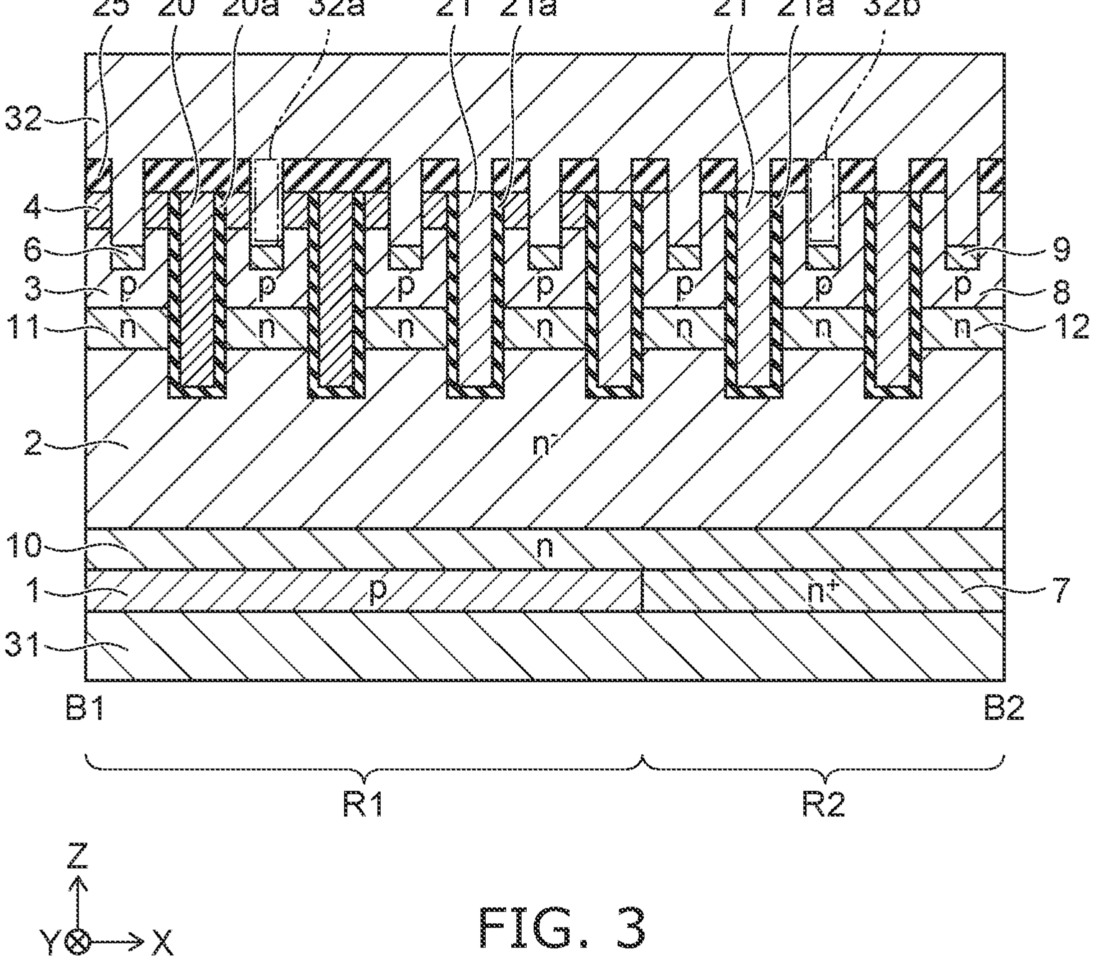
FIG. 3 is a B1-B2 cross-sectional view of FIG. 2.
Figure 4:
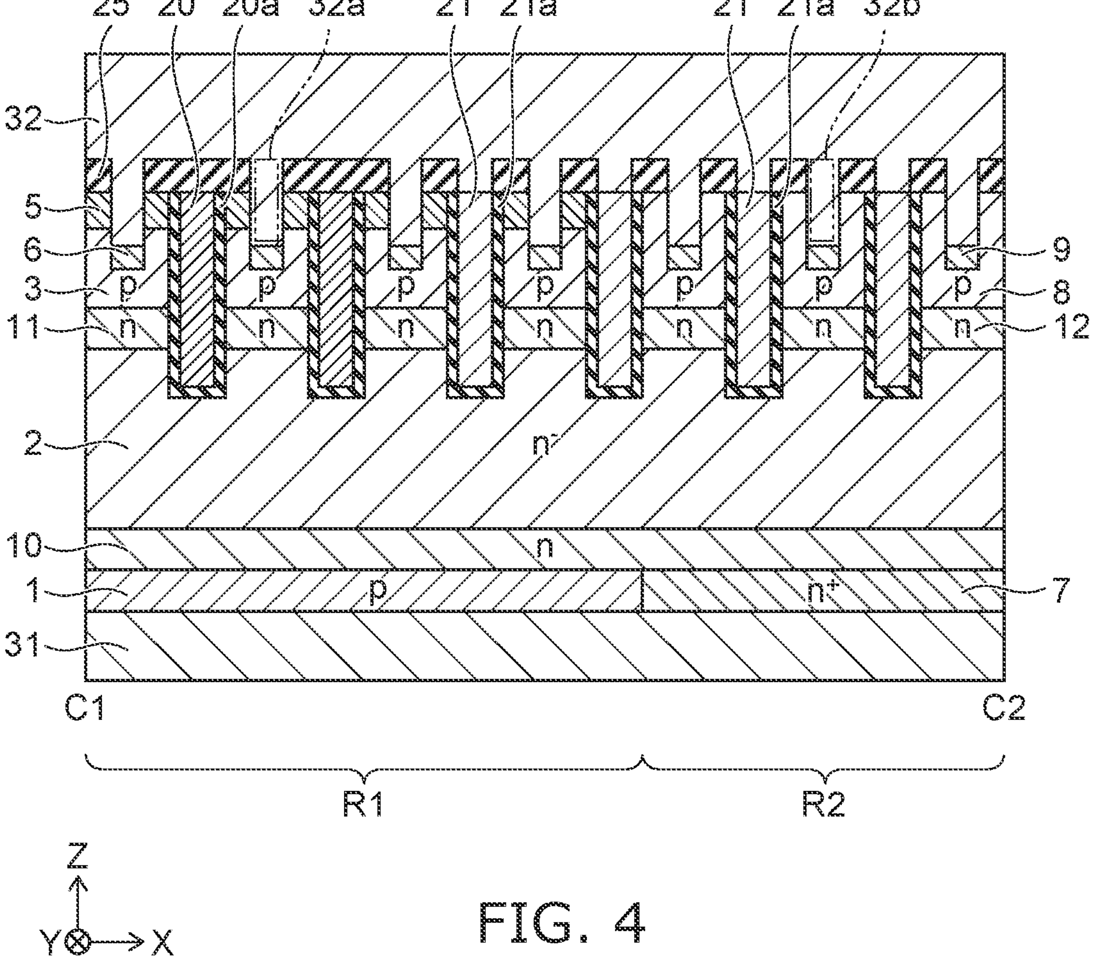
FIG. 4 is a C1-C2 cross-sectional view of FIG. 2.
Figure 5:
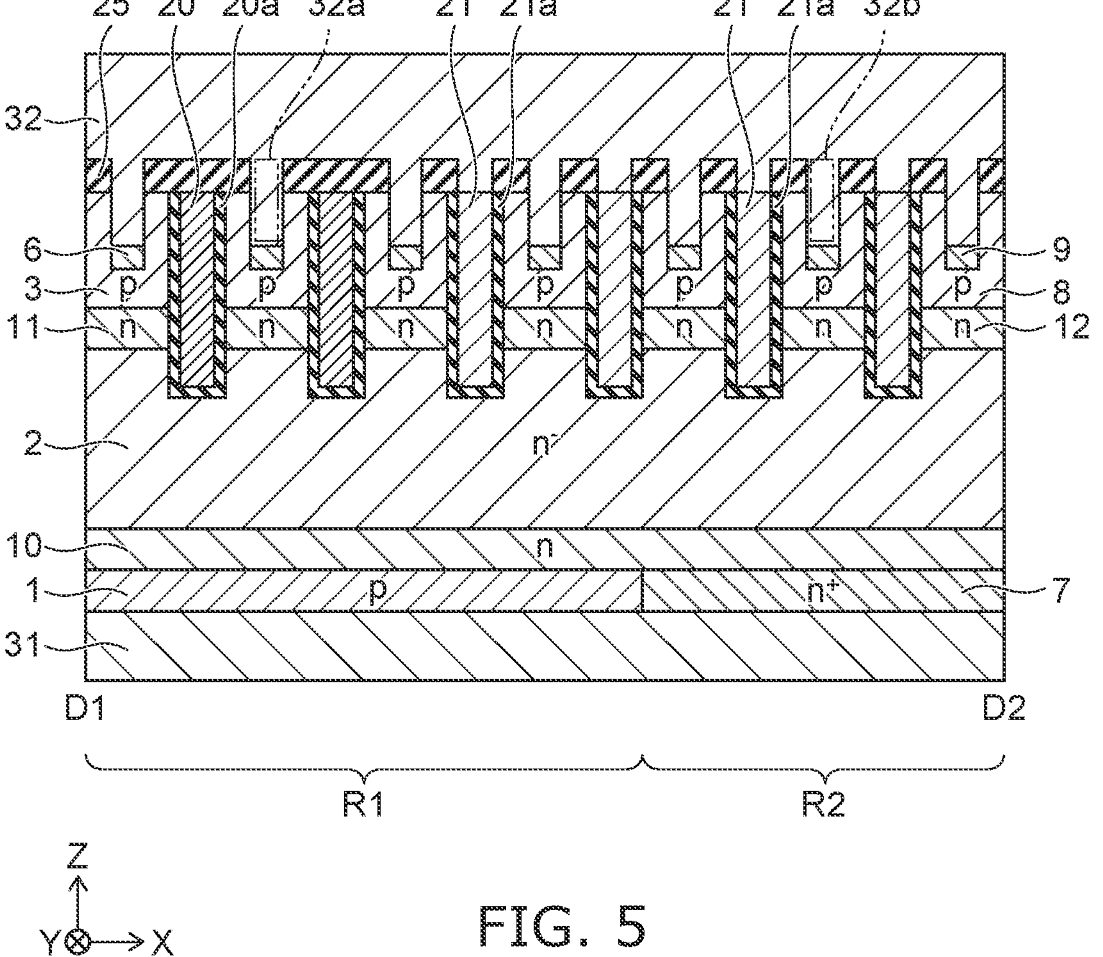
FIG. 5 is a D1-D2 cross-sectional view of FIG. 2.

FIG. 1 is a plan view of a semiconductor device according to a first embodiment. FIG. 2 is an enlarged plan view of portion A of FIG. 1. FIG. 3 is a B1-B2 cross-sectional view of FIG. 2. FIG. 4 is a C1-C2 cross-sectional view of FIG. 2. FIG. 5 is a D1-D2 cross-sectional view of FIG. 2. An insulating layer 25 and an emitter electrode 32 are see-through in FIG. 2.

The semiconductor device according to the first embodiment is an RC-IGBT. As shown in FIGS. 1 to 5, the semiconductor device 100 according to the first embodiment includes a p-type (first-conductivity-type) collector region 1 (a first semiconductor region), an $n^-$-type (second-conductivity-type) base region 2 (second semiconductor region), a p-type base region 3 (a third semiconductor region), an $n^+$-type emitter region 4 (a fourth semiconductor region), a $p^+$-type contact region 5 (a fifth semiconductor region), a $p^+$-type contact region 6 (a sixth semiconductor region), an $n^+$-type cathode region 7 (a seventh semiconductor region), a p-type anode region 8 (an eighth semiconductor region), a $p^+$-type anode region 9, an n-type buffer region 10, an n-type barrier region 11, an n-type barrier region 12, a gate electrode 20, a conductive part 21, the insulating layer 25, a collector electrode 31 (a first electrode), the emitter electrode 32 (a second electrode), and a gate pad 33.

An XYZ orthogonal coordinate system is used in the description of embodiments. The direction from the collector electrode 31 toward the emitter electrode 32 is taken as a Z-direction (a first direction). Two mutually-orthogonal directions perpendicular to the Z-direction are taken as an X-direction (a second direction) and a Y-direction (a third direction). In the description, the direction from the collector electrode 31 toward the emitter electrode 32 is called "up", and the opposite direction is called "down". These directions are based on the relative positional relationship of the collector electrode 31 and the emitter electrode 32 and are independent of the direction of gravity.

As shown in FIG. 1, the emitter electrode 32 and the gate pad 33 are located at the upper surface of the semiconductor device 100. The emitter electrode 32 and the gate pad 33 are separated from each other. For example, multiple emitter electrodes 32 are arranged in the Y-direction. A gate wiring part 33*a* is located around the emitter electrodes 32. A portion of the gate wiring part 33*a* extends in the Y-direction between the emitter electrodes 32. The gate wiring part 33*a* is electrically connected with the gate pad 33.

As shown in FIGS. 1 and 2, the semiconductor device 100 includes an IGBT region R1 (a first region) and a diode region R2 (a second region). In the example shown in FIG. 1, multiple IGBT regions R1 and multiple diode regions R2 are arranged in the X-direction and the Y-direction. The IGBT region R1 and the diode region R2 are alternately arranged in the X-direction.

As shown in FIGS. 3 to 5, the collector electrode 31 is located at the lower surface of the semiconductor device 100. The collector electrode 31 and the emitter electrode 32 are separated from each other; and the multiple IGBT regions R1 and the multiple diode regions R2 are positioned between the collector electrode 31 and the emitter electrode 32.

As shown in FIGS. 2 to 5, the p-type collector region 1, a portion of the $n^-$-type base region 2, the p-type base region 3, the $n^+$-type emitter region 4, the $p^+$-type contact region 5, the $p^+$-type contact region 6, a portion of the n-type buffer region 10, the n-type barrier region 11, and the gate electrode 20 are located in each IGBT region R1.

The p-type collector region 1 is located on a portion of the collector electrode 31 and is electrically connected with the collector electrode 31. A portion of the $n^-$-type base region 2 is located on the p-type collector region 1. The p-type base region 3 is located on the portion of the $n^-$-type base region 2 and positioned on the p-type collector region 1. The gate electrode 20 faces the p-type base region 3 via a gate insulating layer 20*a* in the X-direction.

As shown in FIG. 3, the $n^+$-type emitter region 4 is located on the p-type base region 3. The emitter electrode 32 includes a contact part 32*a* protruding toward the collector electrode 31. The $n^+$-type emitter region 4 is arranged with the contact part 32*a* in the X-direction.

As shown in FIG. 4, the $p^+$-type contact region 5 is located on the p-type base region 3 and arranged with the contact part 32*a* in the X-direction. As shown in FIG. 2, the $p^+$-type contact region 5 is positioned between the $n^+$-type emitter region 4 and a portion of the p-type base region 3 in the Y-direction. The p-type impurity concentration of the $p^+$-type contact region 5 is greater than the p-type impurity concentration of the p-type base region 3.

As shown in FIGS. 3 to 5, the $p^+$-type contact region 6 is located between the p-type base region 3 and the contact part 32*a* in the Z-direction. The $p^+$-type contact region 6 is positioned lower than the $n^+$-type emitter region 4 and the $p^+$-type contact region 5. The p-type impurity concentration of the $p^+$-type contact region 6 is greater than the p-type impurity concentration of the p-type base region 3. The p-type base region 3, the $n^+$-type emitter region 4, the $p^+$-type contact region 5, and the $p^+$-type contact region 6 are electrically connected with the emitter electrode 32.

The Y-direction end portion of the gate electrode 20 is electrically connected with the gate wiring part 33*a*. The insulating layer 25 is located between the gate electrode 20 and the emitter electrode 32; and the gate electrode 20 and the emitter electrode 32 are electrically isolated from each other.

As shown in FIGS. 3 to 5, multiple p-type base regions 3, $n^+$-type emitter regions 4, $p^+$-type contact regions 5, $p^+$-type contact regions 6, gate electrodes 20, and contact parts 32*a* are arranged in the X-direction. The multiple p-type base regions 3, the multiple $p^+$-type contact regions 6, the multiple gate electrodes 20, and the multiple contact parts 32*a* each are provided in stripe shapes and extend in the Y-direction. Multiple $n^+$-type emitter regions 4 and multiple $p^+$-type contact regions 5 also are arranged in the Y-direction.

As one specific example, one $n^+$-type emitter region 4 on one p-type base region 3 is positioned between a pair of $p^+$-type contact regions 5 as shown in FIG. 2. A portion of the p-type base region 3 is alternately arranged in the Y-direction with a group G including the one $n^+$-type emitter region 4 and the pair of $p^+$-type contact regions 5.

The $n^+$-type cathode region 7, another portion of the $n^-$-type base region 2, the p-type anode region 8, the $p^+$-type anode region 9, another portion of the n-type buffer region 10, the n-type barrier region 12, and the conductive part 21 are located in each diode region R2. The $n^+$-type cathode region 7 is located on another portion of the collector electrode 31 and is electrically connected with the collector electrode 31. The other portion of the $n^-$-type base region 2 is located on the $n^+$-type cathode region 7. The p-type anode region 8 is located on the other portion of the $n^-$-type base region 2 and positioned on the $n^+$-type cathode region 7.

The conductive part 21 faces the p-type anode region 8 via an insulating layer 21*a* in the X-direction. The $p^+$-type anode region 9 is located on the p-type anode region 8. The p-type impurity concentration of the $p^+$-type anode region 9 is greater than the p-type impurity concentration of the p-type anode region 8. The p-type anode region 8, the $p^+$-type anode region 9, and the conductive part 21 are electrically connected with the emitter electrode 32.

As shown in FIGS. 3 to 5, the emitter electrode 32 may include a contact part 32*b* protruding toward the collector electrode 31. A portion of the p-type anode region 8 is arranged with the contact part 32*b* in the X-direction. The $p^+$-type anode region 9 is located between the p-type anode region 8 and the emitter electrode 32 in the Z-direction.

Multiple p-type anode regions 8, $p^+$-type anode regions 9, conductive parts 21, and contact parts 32*b* are arranged in the X-direction. The multiple p-type anode regions 8, the multiple $p^+$-type anode regions 9, the multiple conductive parts 21, and the multiple contact parts 32*b* each are provided in stripe shapes and extend in the Y-direction.

Operations of the semiconductor device 100 will now be described.

A voltage that is not less than a threshold is applied to the gate electrode 20 in a state in which a positive voltage with respect to the emitter electrode 32 is applied to the collector electrode 31. A channel (an inversion layer) is thereby formed in the p-type base region 3. Electrons flow from the $n^+$-type emitter region 4 to the $n^-$-type base region 2 via the channel; and holes flow from the p-type collector region 1 toward the $n^-$-type base region 2. The density of the carriers accumulated in the $n^-$-type base region 2 increases, and conductivity modulation occurs. The electrical resistance in the $n^-$-type base region 2 is greatly reduced thereby, and the IGBT region R1 is set to the on-state. Subsequently, when the voltage applied to the gate electrode 20 drops below the threshold, the channel in the p-type base region 3 disappears, and the IGBT region R1 is switched to the off-state.

After the IGBT region R1 is switched to the off-state, the electrons that accumulated in the $n^-$-type base region 2 are discharged to the collector electrode 31 via the p-type collector region 1. Holes are discharged to the emitter electrode 32 via the p-type base region 3.

For example, a bridge circuit is configured using multiple semiconductor devices 100. When one semiconductor device 100 is switched from the on-state to the off-state, the inductance component of the bridge circuit applies an induced electromotive force to the emitter electrode 32 of another semiconductor device 100. As a result, the diode region R2 of the other semiconductor device 100 operates. Holes flow from the p-type anode region 8 to the $n^-$-type base region 2; and electrons flow from the $n^+$-type cathode region 7 to the $n^-$-type base region 2. The diode region R2 functions as a freewheeling diode (FWD).

As shown in FIGS. 3 to 5, the n-type buffer region 10 may be provided between the p-type collector region 1 and the $n^-$-type base region 2 and between the $n^+$-type cathode region 7 and the $n^-$-type base region 2. The n-type impurity concentration of the n-type buffer region 10 is less than the n-type impurity concentration of the $n^+$-type cathode region 7 and greater than the n-type impurity concentration of the $n^-$-type base region 2. By providing the n-type buffer region 10, spreading of the depletion layer in the $n^-$-type base region 2 can be more reliably suppressed by the n-type buffer region 10.

The n-type barrier region 11 may be provided between the $n^-$-type base region 2 and the p-type base region 3. By providing the n-type barrier region 11, the discharge of the holes that accumulate in the $n^-$-type base region 2 when the IGBT region R1 is in the on-state can be suppressed, and the carrier density in the $n^-$-type base region 2 can be increased. The electrical resistance when the IGBT region R1 is in the on-state can be reduced thereby. In addition to the n-type barrier region 11, the n-type barrier region 12 may be provided between the $n^-$-type base region 2 and the p-type anode region 8. The n-type impurity concentrations of the n-type barrier region 11 and the n-type barrier region 12 each are greater than the n-type impurity concentration of the $n^-$-type base region 2.

In the IGBT region R1, some of the multiple gate electrodes 20 may be replaced with the conductive part 21. By replacing some of the gate electrodes 20 with the conductive part 21, the carrier density in the $n^-$-type base region 2 when the IGBT region R1 is in the on-state can be increased, and the electrical resistance of the semiconductor device 100 can be further reduced.

Examples of the materials of the components of the semiconductor device 100 will now be described.

The p-type collector region 1, the $n^-$-type base region 2, the p-type base region 3, the $n^+$-type emitter region 4, the $p^+$-type contact region 5, the $p^+$-type contact region 6, the $n^+$-type cathode region 7, the p-type anode region 8, the $p^+$-type anode region 9, the n-type buffer region 10, the n-type barrier region 11, and the n-type barrier region 12 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate electrode 20 and the conductive part 21 include conductive materials such as polysilicon, etc. The gate insulating layer 20*a*, the insulating layer 21*a*, and the insulating layer 25 include insulating materials such as silicon oxide, silicon nitride, silicon oxynitride, etc. The collector electrode 31, the emitter electrode 32, the gate pad 33, and the gate wiring part 33*a* include metals such as aluminum, etc. The contact parts 32*a* and 32*b* may include barrier metal layers at parts that contact the semiconductor regions and the insulating layer 25. The barrier metal layers include titanium, titanium nitride, etc.

Figures 6, 7:
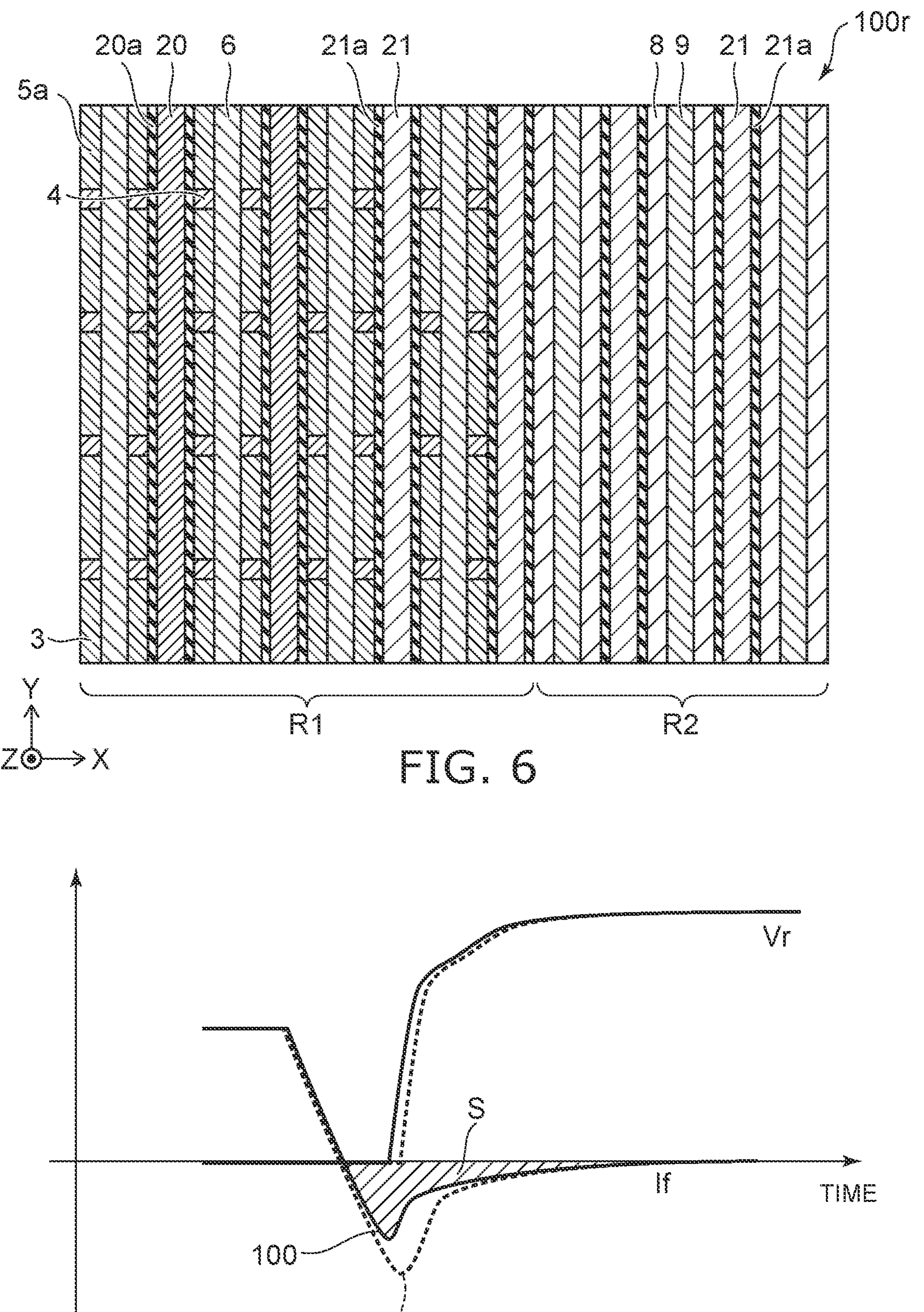
FIG. 6 is a plan view showing a portion of a semiconductor device according to a reference example.
FIG. 7 is a schematic view illustrating characteristics of the semiconductor devices.

FIG. 6 is a plan view showing a portion of a semiconductor device according to a reference example.

In the semiconductor device 100*r* according to the reference example shown in FIG. 6, the $n^+$-type emitter region 4 and a $p^+$-type contact region 5*a* are alternately arranged along the Y-direction in the IGBT region R1. In other words, the $p^+$-type contact region 5*a* is located in all regions between the $n^+$-type emitter regions 4 in the Y-direction.

Advantages of the first embodiment will now be described.

The semiconductor device 100*r* includes a parasitic thyristor made of the p-type collector region 1, the $n^-$-type base region 2, the p-type base region 3, and the $n^+$-type emitter region 4. When the IGBT region R1 is switched to the off-state, holes flow in the p-type base region 3. The parasitic thyristor may operate when the flow of holes causes the potential of the p-type base region 3 to increase. When the parasitic thyristor operates, a large current flows in the semiconductor device 100*r*; and breakdown of the semiconductor device 100*r* occurs.

In the semiconductor device 100*r*, the $p^+$-type contact region 5*a* is provided between the $n^+$-type emitter regions 4 to suppress the operation of the parasitic thyristor. The p-type impurity concentration of the $p^+$-type contact region 5*a* is greater than the p-type impurity concentration of the p-type base region 3. When holes flow in the p-type base region 3, the holes are easily discharged to the emitter electrode 32 via the $p^+$-type contact region 5*a*. The operation of the parasitic thyristor can be suppressed thereby. In other words, the latchup withstand capacity of the semiconductor device 100*r* can be improved.

On the other hand, the IGBT region R1 also includes a parasitic diode made of the $n^-$-type base region 2 and the p-type base region 3 and a parasitic diode made of the p-type base region 3 and the $n^+$-type cathode region 7. When the diode region R2 is in the on-state, the operation of the parasitic diode of the IGBT region R1 may cause holes to flow from the emitter electrode 32 to the $n^-$-type base region 2. In particular, when the $p^+$-type contact region 5*a* is provided in the IGBT region R1, more holes flow toward the $n^-$-type base region 2 because the electrical resistance between the $p^+$-type contact region 5*a* and the emitter electrode 32 is low. The carriers that accumulate in the $n^-$-type base region 2 are increased thereby. When the diode region R2 is switched to the off-state, more time is necessary for the discharge of the carriers accumulated in the $n^-$-type base region 2. As a result, the switching of the diode region R2 from the on-state to the off-state is slower. For example, the high-speed operation of the diode region R2 is lost.

For this problem, in the semiconductor device 100 according to the embodiment, the $p^+$-type contact region 5 is located between the $n^+$-type emitter region 4 and a portion of the p-type base region 3. In other words, when comparing the semiconductor device 100 and the semiconductor device 100*r*, the Y-direction length of the $p^+$-type contact region 5 is less than the Y-direction length of the $p^+$-type contact region 5*a*. The area of the $p^+$-type contact region 5 per unit area is less than the area of the $p^+$-type contact region 5*a* per unit area. In the semiconductor device 100, a portion of the $p^+$-type contact region 5*a* is omitted, and a portion of the p-type base region 3 is provided instead.

By providing the $p^+$-type contact region 5 instead of the $p^+$-type contact region 5*a*, the flow of the holes toward the $n^-$-type base region 2 via the $p^+$-type contact region 5 when the diode region R2 is in the on-state can be suppressed. The operation of the diode region R2 can be faster, and the switching loss due to the operation of the diode region R2 can be reduced. The $p^+$-type contact region 5 is located between the $n^+$-type emitter region 4 and a portion of the p-type base region 3, and is adjacent to the $n^+$-type emitter region 4. Therefore, when the IGBT region R1 is switched to the off-state, the holes that flow through the $n^+$-type emitter region 4 vicinity easily flow to the $p^+$-type contact region 5. The increase of the potential in the region at the $n^+$-type emitter region 4 vicinity can be suppressed, and the latchup of the semiconductor device 100 can be suppressed.

The semiconductor device 100 further includes the $p^+$-type contact region 6. The $p^+$-type contact region 6 is positioned lower than the $n^+$-type emitter region 4. Therefore, the holes that flow toward the p-type base region 3 are discharged to the contact part 32*a* via the $p^+$-type contact region 6 before passing through the $n^+$-type emitter region 4 vicinity. The amount of holes passing through the $n^+$-type emitter region 4 vicinity can be reduced, and the increase of the potential in the region at the $n^+$-type emitter region 4 vicinity can be suppressed. As a result, the latchup of the semiconductor device 100 can be further suppressed.

FIG. 7 is a schematic view illustrating characteristics of the semiconductor devices.

In FIG. 7, the horizontal axis is time. The vertical axis is the magnitude of the voltage or current. A voltage with respect to the emitter electrode 32 that is applied to the collector electrode 31 is represented positive in the graph. The current that flows from the emitter electrode 32 toward the collector electrode 31 also is represented positive in the graph.

When the diode region R2 is in the on-state, a current If flows from the emitter electrode 32 toward the collector electrode 31. When the diode region R2 is switched from the on-state to the off-state and a voltage Vr of the collector electrode 31 increases, the carriers that accumulated in the $n^-$-type base region 2 are discharged. Therefore, a negative current If flows in the diode region R2. At this time, the operation speed of the diode region R2 increases as the current If decreases (approaches zero).

In FIG. 7, the broken lines illustrate the characteristics of the semiconductor device 100*r* according to the reference example. The solid lines illustrate the characteristics of the semiconductor device 100 according to the embodiment. As shown in FIG. 7, the current If when the diode region R2 is switched to the off-state is smaller in the semiconductor device 100 according to the embodiment than in the semiconductor device 100*r* according to the reference example. In other words, the diode region R2 of the semiconductor device 100 can operate faster than the diode region R2 of the semiconductor device 100*r*.

According to the embodiment, the diode region R2 can operate faster while the reduction of the latchup withstand capacity of the semiconductor device 100 is suppressed.

First Modification

Figure 8:
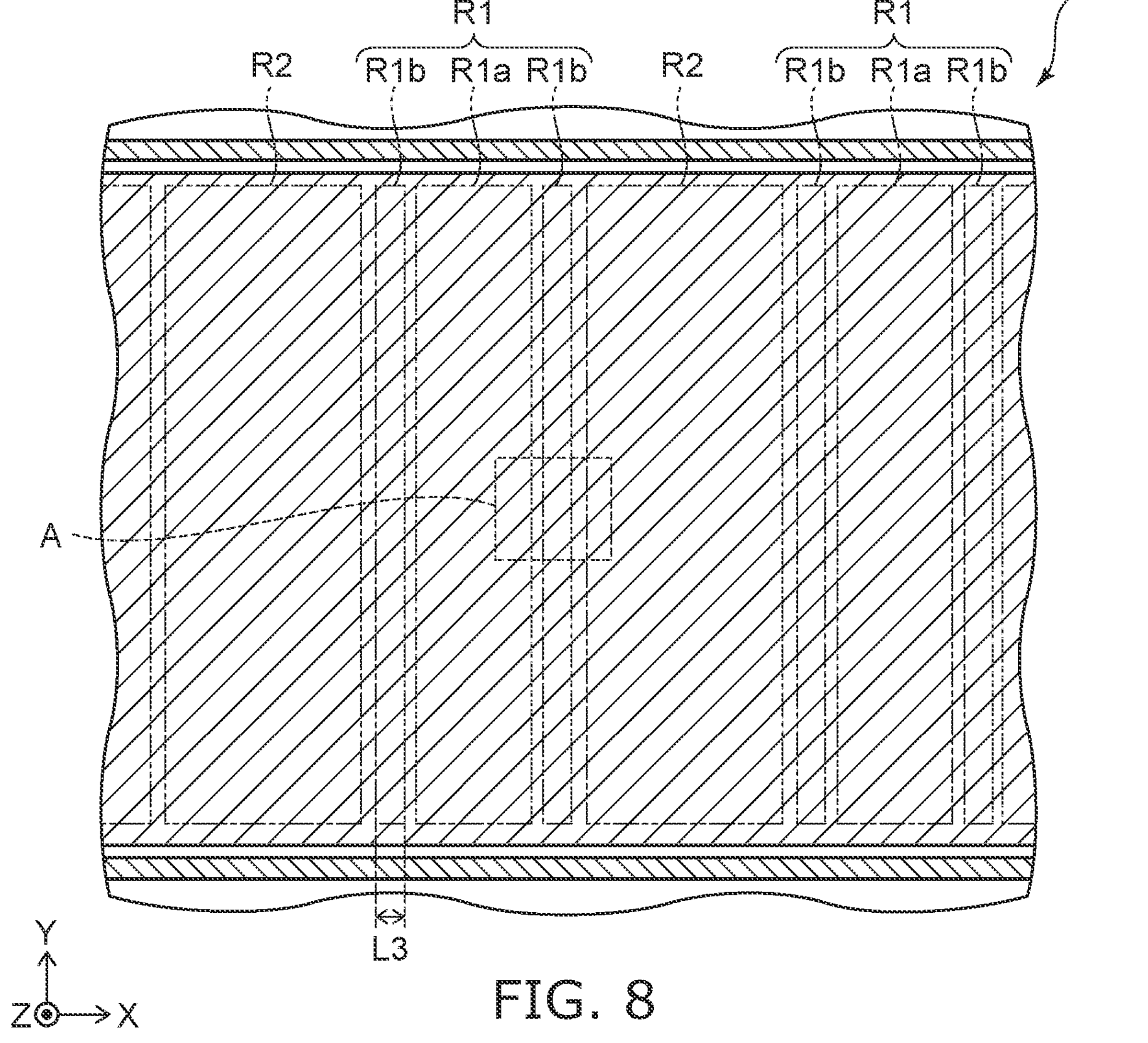
FIG. 8 is a plan view showing a portion of a semiconductor device according to a first modification of the first embodiment.

FIG. 8 is a plan view showing a portion of a semiconductor device according to a first modification of the first embodiment.

In the semiconductor device 110 according to the first modification shown in FIG. 8, the IGBT region R1 includes a first part R1*a* and a second part R1*b*. The second part R1*b* is located between the first part R1*a* and the diode region R2. When the IGBT region R1 and the diode region R2 are alternately arranged in the X-direction as shown in FIG. 8, one IGBT region R1 is positioned between a pair of diode regions R2. One first part R1*a* is positioned between a pair of second parts R1*b* in the one IGBT region R1.

The p-type base region 3, the $n^+$-type emitter region 4, the $p^+$-type contact region 5, the $p^+$-type contact region 6, and the gate electrode 20 each are located in the first part R1*a* and in the second part R1*b*. Some of the multiple gate electrodes 20 may be replaced with the conductive part 21 in the first part R1*a*. Some or all of the multiple gate electrodes 20 may be replaced with the conductive part 21 in the second part R1*b*.

Figure 9:
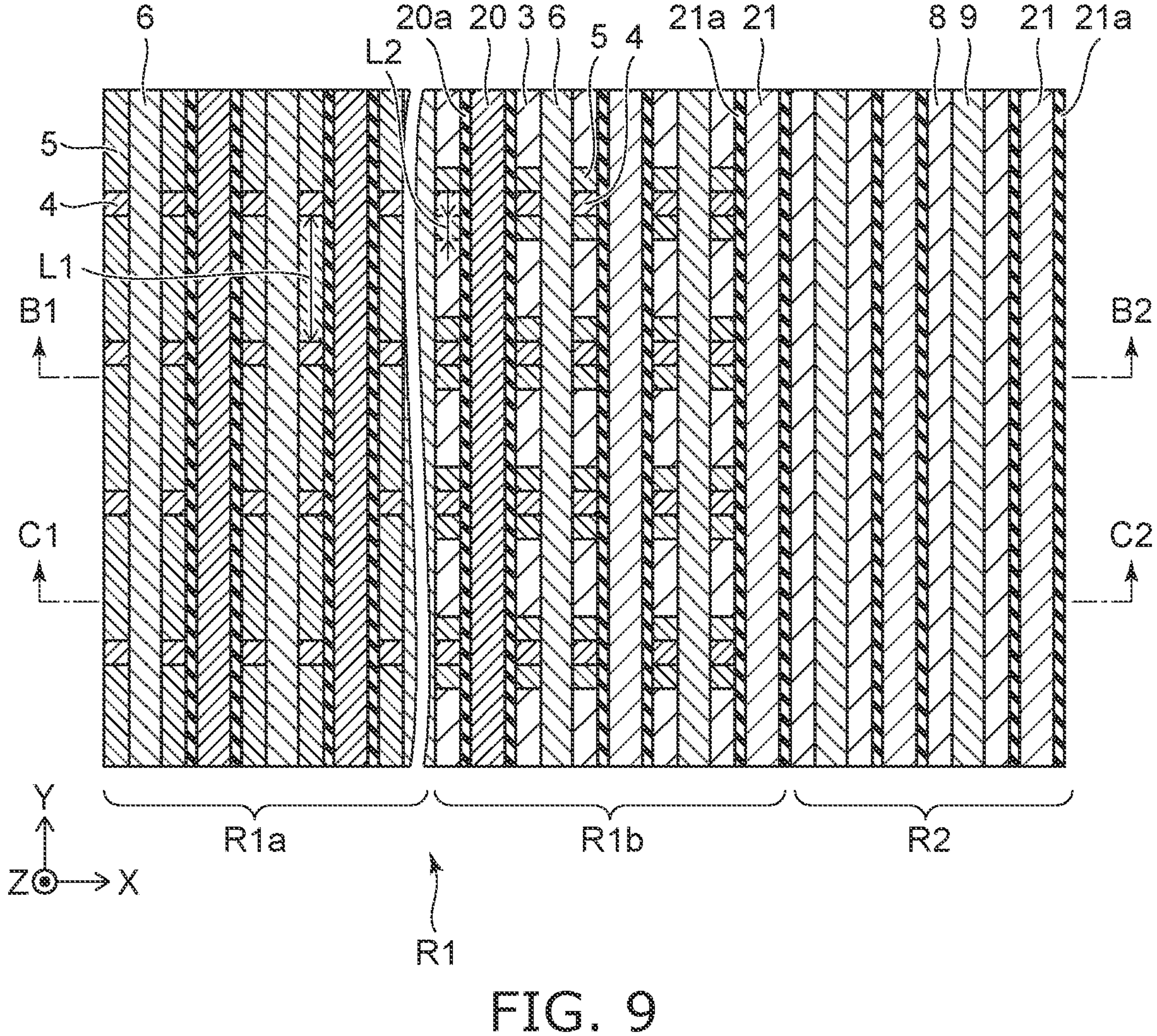
FIG. 9 is an enlarged plan view of portion A of FIG. 8.
Figure 10:
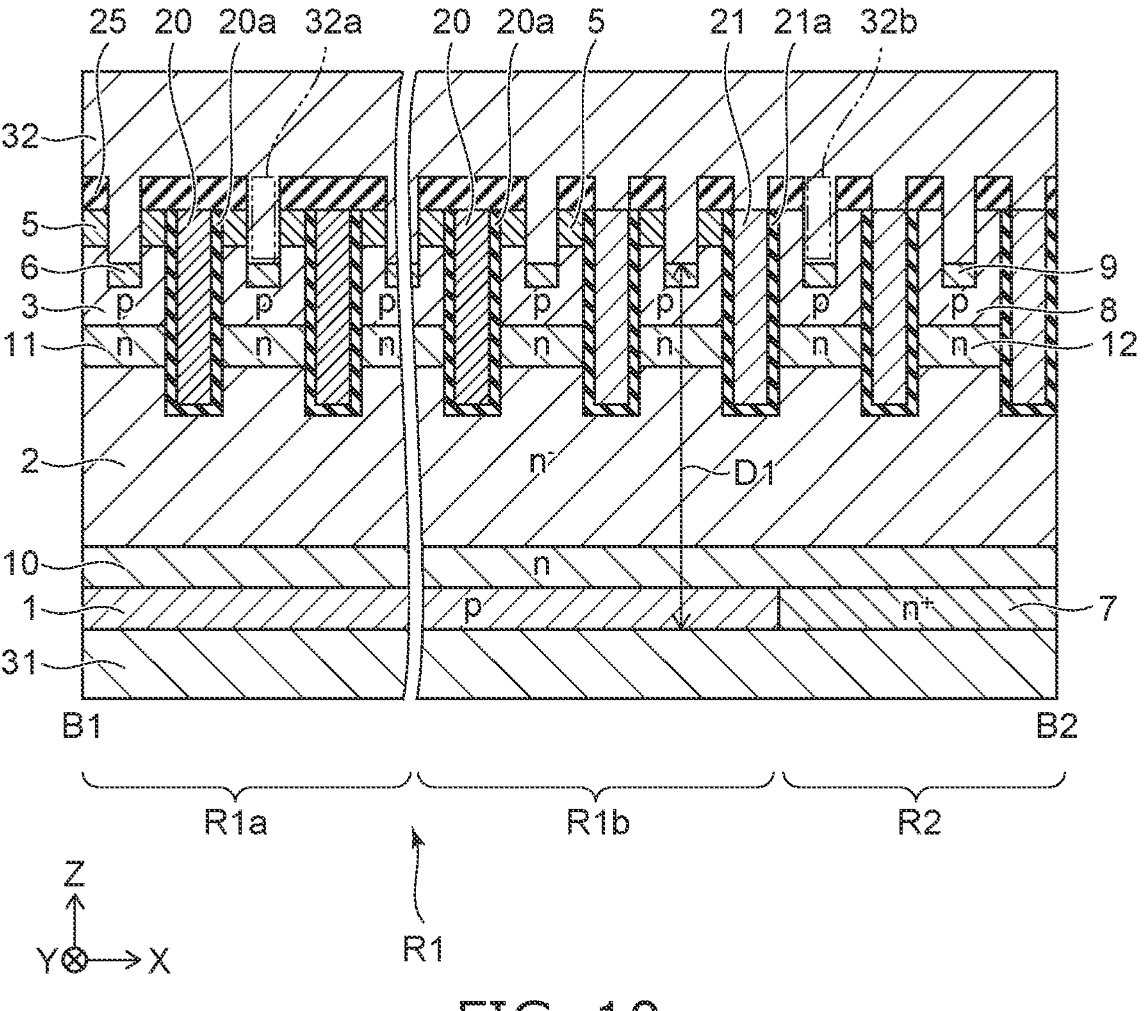
FIG. 10 is a B1-B2 cross-sectional view of FIG. 9.
Figure 11:
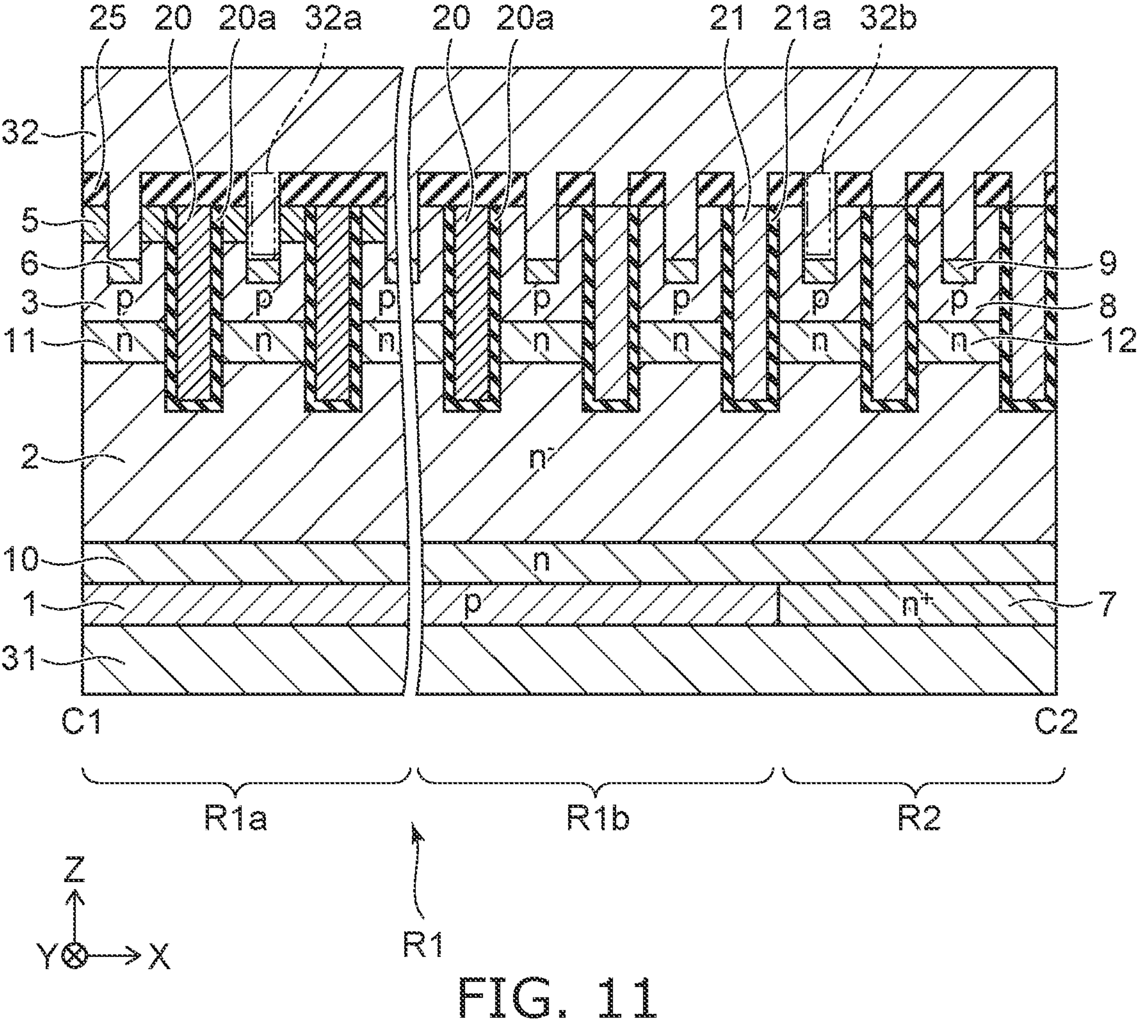
FIG. 11 is a C1-C2 cross-sectional view of FIG. 9.

FIG. 9 is an enlarged plan view of portion A of FIG. 8. FIG. 10 is a B1-B2 cross-sectional view of FIG. 9. FIG. 11 is a C1-C2 cross-sectional view of FIG. 9.

As shown in FIG. 9, the Y-direction length of the $p^+$-type contact region 5 is different between the first part R1*a* and the second part R1*b*. A length L1 in the Y-direction of the $p^+$-type contact region 5 located in the first part R1*a* is greater than a length L2 in the Y-direction of the $p^+$-type contact region 5 located in the second part R1*b*. Therefore, in the X-Y plane, the area of the $p^+$-type contact region 5 per unit area in the first part R1*a* is greater than the area of the $p^+$-type contact region 5*a* per unit area in the second part R1*b*.

In the illustrated example, in the first part R1*a*, the $p^+$-type contact region 5 is located in all of the regions between the $n^+$-type emitter regions 4 adjacent to each other in the Y-direction. In the second part R1*b*, a pair of $p^+$-type contact regions 5 and a portion of the p-type base region 3 are located in the regions between the $n^+$-type emitter regions 4 adjacent to each other in the Y-direction.

As shown in FIG. 10, a portion of the $p^+$-type contact region 5 located in the first part R1*a* is arranged in the X-direction with the $p^+$-type contact region 5 located in the second part R1*b*. As shown in FIG. 11, another portion of the $p^+$-type contact region 5 located in the first part R1*a* is arranged in the X-direction with the p-type base region 3 located in the second part R1*b*. Other than the size of the $p^+$-type contact region 5, the structures of the IGBT region R1 and the diode region R2 of the semiconductor device 110 are similar to the structures of the IGBT region R1 and the diode region R2 of the semiconductor device 100.

Advantages of the first modification will now be described.

As described above, when the diode region R2 is switched to the on-state, holes flow from the parasitic diode of the IGBT region R1 to the $n^-$-type base region 2. At this time, more holes flow toward the $n^-$-type base region 2 in the part of the IGBT region R1 more proximate to the diode region R2. In other words, the amount of holes flowing through the parasitic diode of the second part R1*b* is greater than the amount of holes flowing through the parasitic diode of the first part R1*a*. Therefore, by shortening the $p^+$-type contact region 5 in the second part R1*b*, the amount of holes flowing toward the $n^-$-type base region 2 due to the parasitic diode can be effectively reduced. Also, the distance along the X-Y plane between the first part R1*a* and the $n^+$-type cathode region 7 is greater than the distance along the X-Y plane between the second part R1*b* and the $n^+$-type cathode region 7. In the first part R1*a*, compared to the second part R1*b*, the potential between the n-type buffer region 10 and the p-type collector region 1 is easily biased in the forward direction. Therefore, there is a tendency for the amount of holes injected from the p-type collector region 1 to be greater in the first part R1*a* than in the second part R1*b*. By lengthening the $p^+$-type contact region 5 in the first part R1*a*, the potential of the p-type base region 3 located in the first part R1*a* increases less easily. The latchup withstand capacity can be increased.

According to the semiconductor device 110 according to the first modification, compared to the semiconductor device 100, the latchup withstand capacity can be improved while suppressing the reduction of the operation speed of the diode region R2.

In the semiconductor device 110, it is favorable for a length L3 in the X-direction of the second part R1*b* (shown in FIG. 8) to be greater than a distance D1 in the Z-direction between the collector electrode 31 and the emitter electrode 32 (shown in FIG. 10). In other words, the length L3 is the X-direction distance between the first part R1*a* and the diode region R2. By setting the length L3 to be greater than the distance D1, the distance between the $p^+$-type contact region 5 of the first part R1*a* and the $n^+$-type cathode region 7 of the diode region R2 can be increased. The amount of holes flowing through the parasitic diode of the first part R1*a* can be further reduced. On the other hand, when the length L3 is excessively long, the size of the first part R1*a* becomes small, and the effect of improving the latchup withstand capacity becomes small. To effectively reduce the inflow of holes due to the parasitic diode while increasing the effect of improving the latchup withstand capacity, it is favorable for the length L3 to be greater than the distance D1 and less than two times the distance D1.

When measuring the length L3, the boundary between the first part R1*a* and the second part R1*b* can be discriminated based on the length difference of the $p^+$-type contact region 5. The X-direction position of the boundary between the p-type collector region 1 and the $n^+$-type cathode region 7 can be used as the X-direction position of the boundary between the second part R1*b* and the diode region R2.

Second Modification

Figure 12:
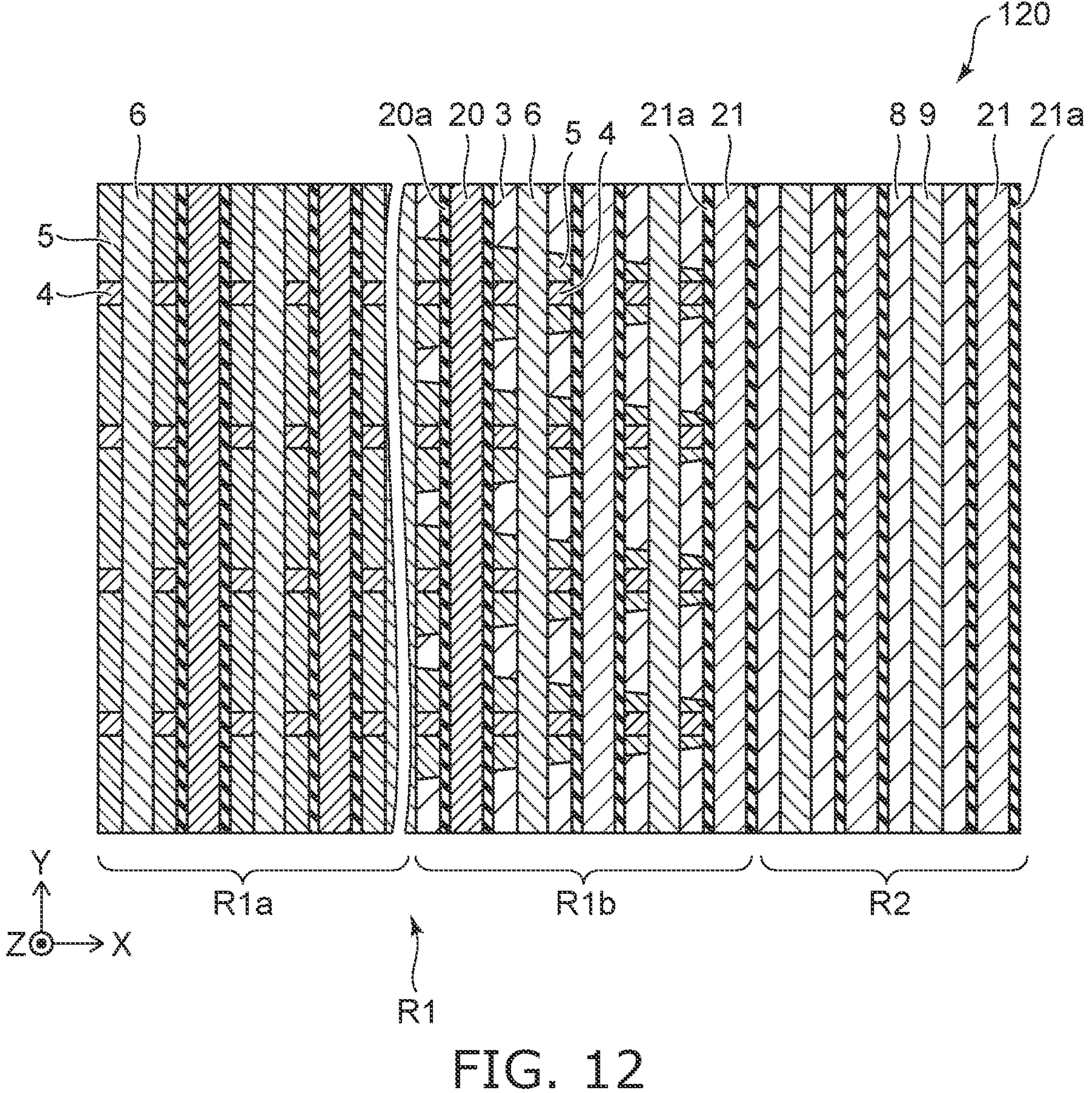
FIG. 12 is a plan view showing a portion of a semiconductor device according to a second modification of the first embodiment.

FIG. 12 is a plan view showing a portion of a semiconductor device according to a second modification of the first embodiment.

In the semiconductor device 120 according to the second modification shown in FIG. 12, the Y-direction lengths of the $p^+$-type contact regions 5 located in the second part R1*b* decrease toward the diode region R2. According to the second modification, the $p^+$-type contact regions 5 are shorter in regions at which the parasitic diode operates more easily. Therefore, the amount of holes flowing toward the $n^-$-type base region 2 due to the parasitic diode can be effectively reduced. The $p^+$-type contact regions 5 are longer in regions at which the parasitic diode operates less easily. The potential of the p-type base region 3 increases less easily, and the latchup of the semiconductor device 120 can be suppressed.

According to the semiconductor device 120 according to the second modification, compared to the semiconductor device 110, the operation speed of the diode region R2 can be further increased, and the latchup withstand capacity can be further improved.

Second Embodiment

Figure 13:
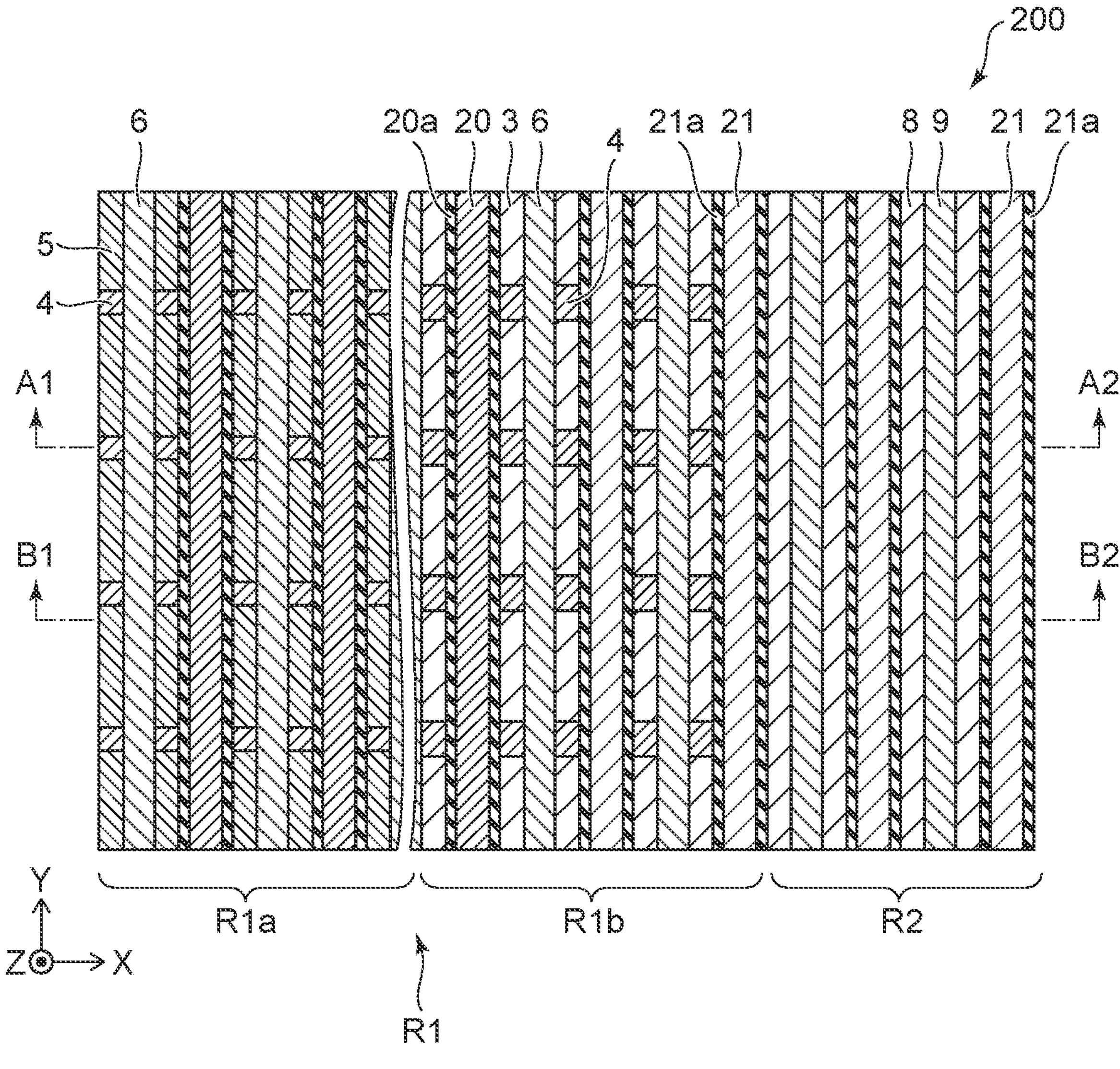
FIG. 13 is a plan view showing a portion of a semiconductor device according to a second embodiment.
Figure 14:
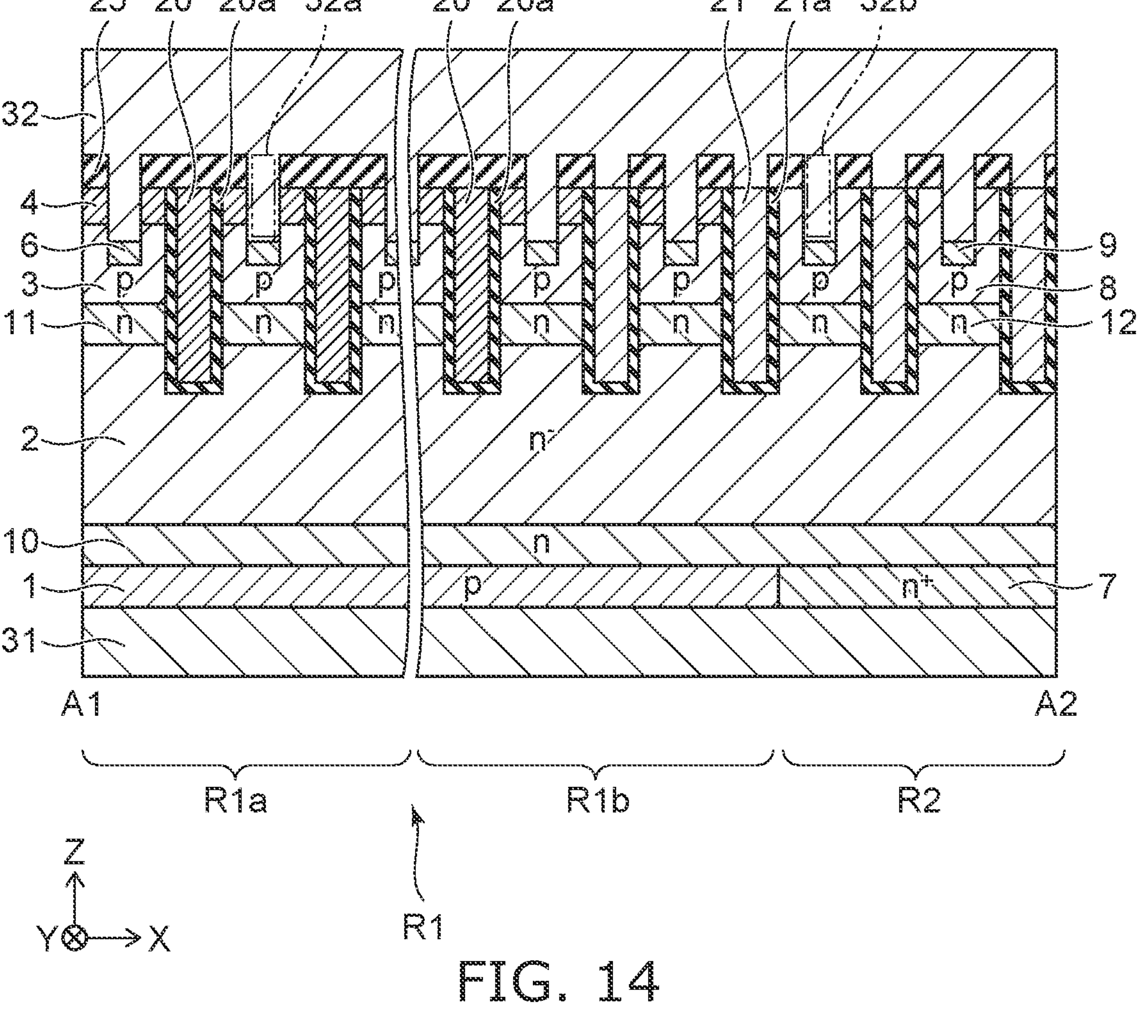
FIG. 14 is an A1-A2 cross-sectional view of FIG. 13.
Figure 15:
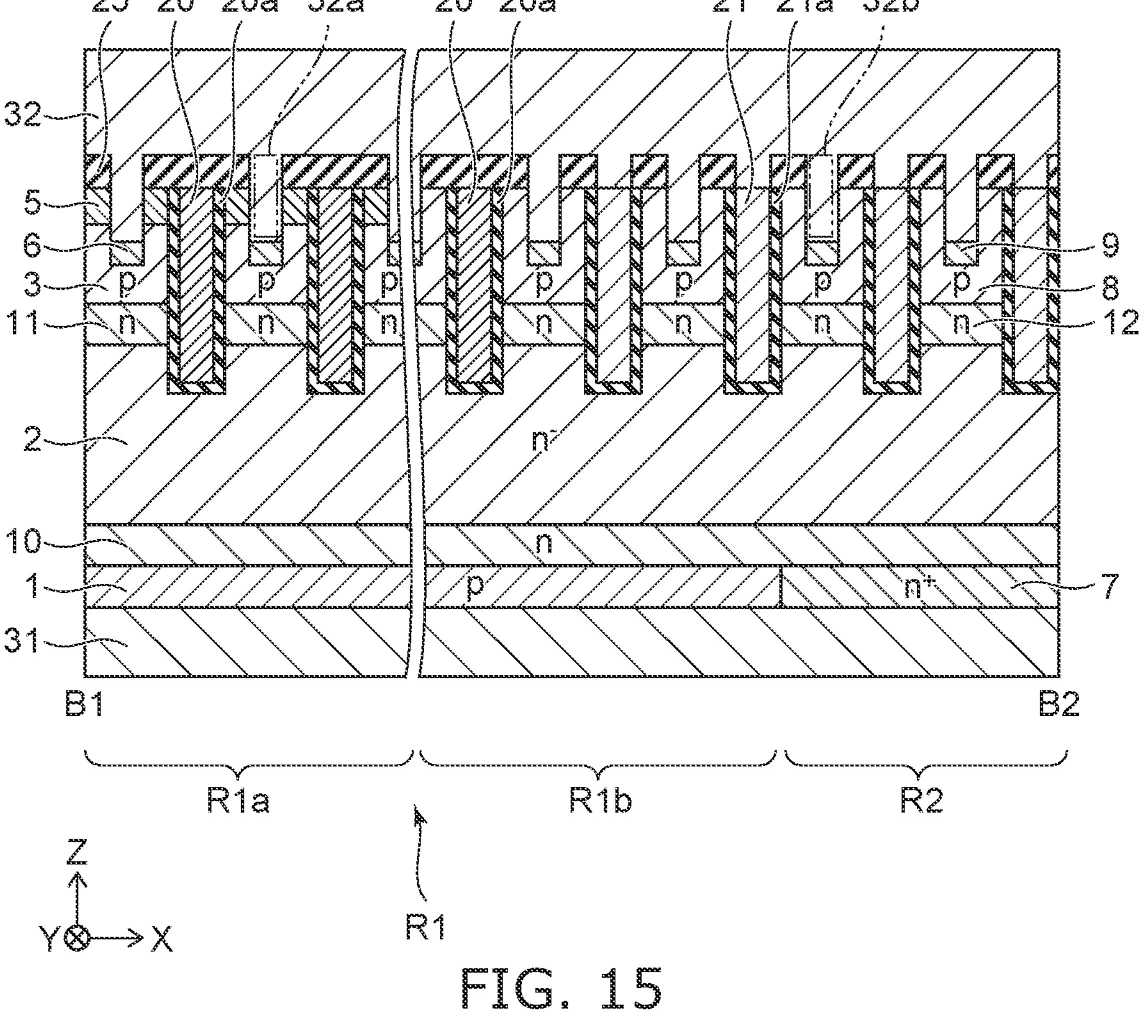
FIG. 15 is a B1-B2 cross-sectional view of FIG. 13.

FIG. 13 is a plan view showing a portion of a semiconductor device according to a second embodiment. FIG. 14 is an A1-A2 cross-sectional view of FIG. 13. FIG. 15 is a B1-B2 cross-sectional view of FIG. 13.

The semiconductor device according to the second embodiment is an RC-IGBT. As shown in FIG. 13, similarly to the semiconductor device 110 or 120 according to the first embodiment, the semiconductor device 200 according to the second embodiment includes the first part R1*a* and the second part R1*b*. The semiconductor device 200 differs from the semiconductor device according to the first embodiment in that the $p^+$-type contact region 5 is not provided in the second part R1*b*.

As shown in FIGS. 13 to 15, in the first part R1*a*, the $p^+$-type contact region 5 is located in all of the regions between the $n^+$-type emitter regions 4 adjacent to each other in the Y-direction. The $n^+$-type emitter region 4 and the $p^+$-type contact region 5 are alternately arranged in the Y-direction. In the second part R1*b*, the p-type base region 3 is located in all of the regions between the $n^+$-type emitter regions 4 adjacent to each other in the Y-direction. The $n^+$-type emitter region 4 and a portion of the p-type base region 3 are alternately arranged in the Y-direction.

In the semiconductor device 200 according to the second embodiment, the $p^+$-type contact region 5 is not provided in the second part R1*b* where holes are easily injected. Therefore, compared to the semiconductor device 100 according to the first embodiment, the operation speed of the diode region R2 can be further increased.

As shown in FIG. 13, the Y-direction length of the $n^+$-type emitter region 4 located in the second part R1*b* may be greater than the Y-direction length of the $n^+$-type emitter region 4 located in the first part R1*a*. The $p^+$-type contact region 5 is not provided in the second part R1*b*. Therefore, in the second part R1*b*, compared to the first part R1*a*, the n-type impurity of the $n^+$-type emitter region 4 diffuses more easily in the Y-direction when the heat treatment for activating the impurity is performed. As a result, the $n^+$-type emitter region 4 of the second part R1*b* becomes longer than the $n^+$-type emitter region 4 of the first part R1*a* in the Y-direction. The removal of the electron current via the $n^+$-type emitter region 4 is promoted thereby, and the injection of holes from the p-type base region 3 to the $n^-$-type base region 2 can be suppressed.

In the semiconductor device 200 as well, it is favorable for the X-direction length of the second part R1*b* to be greater than the Z-direction distance between the collector electrode 31 and the emitter electrode 32 and less than two times this distance. As a result, the inflow of the holes due to the parasitic diode can be effectively reduced while increasing the effect of improving the latchup withstand capacity.

First Modification

Figure 16:
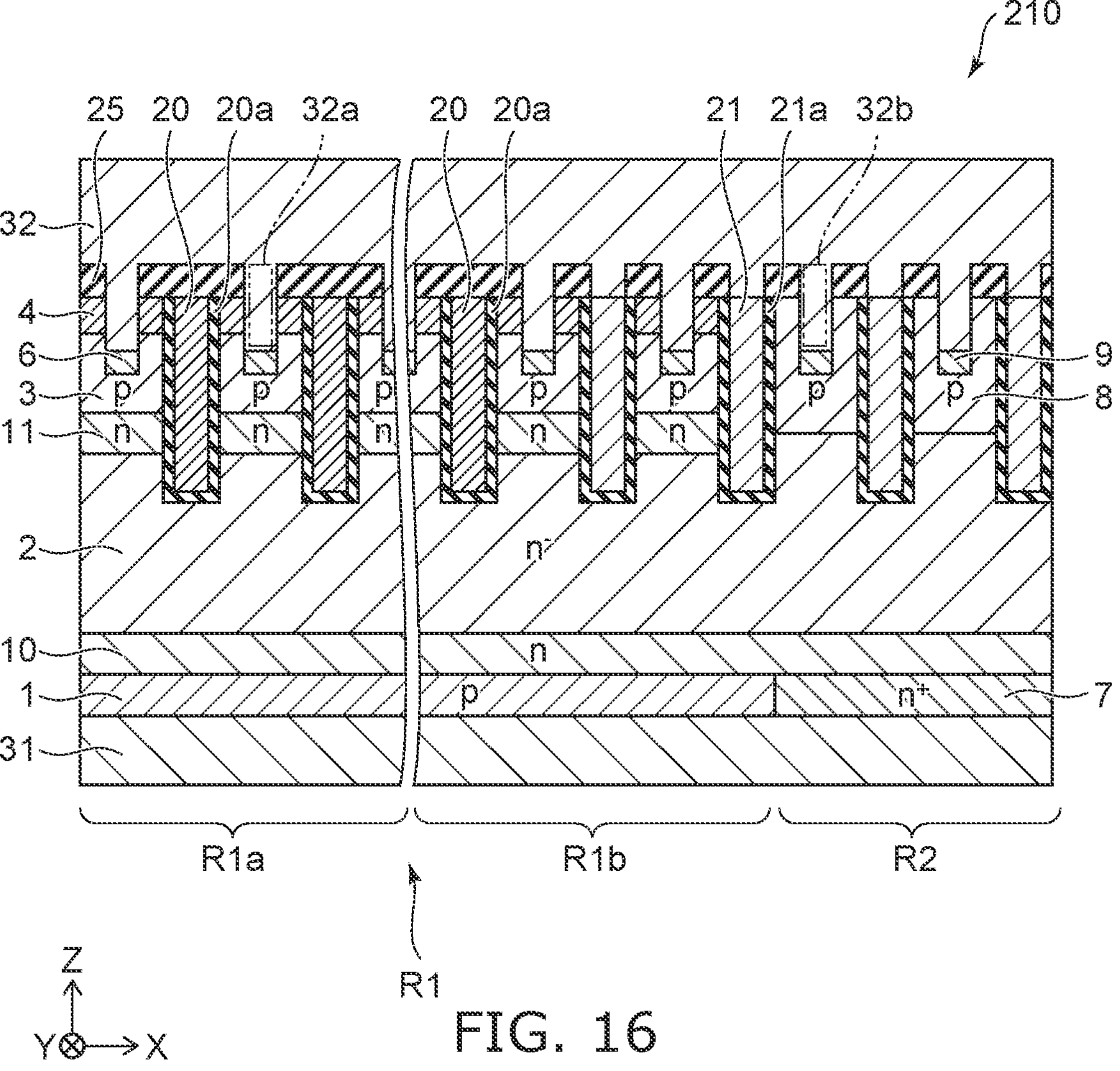
FIG. 16 is a cross-sectional view showing a portion of a semiconductor device according to a first modification of the second embodiment.

FIG. 16 is a cross-sectional view showing a portion of a semiconductor device according to a first modification of the second embodiment.

FIG. 16 corresponds to an X-Z cross-sectional view passing through the $n^+$-type emitter region 4 of the first part R1*a*, the $n^+$-type emitter region 4 of the second part R1*b*, and the diode region R2. In the semiconductor device 210 according to the first modification shown in FIG. 16, the n-type barrier region 12 is not provided in the diode region R2.

For example, the Z-direction length of the p-type anode region 8 is greater than the Z-direction length of the p-type base region 3. The p-type impurity concentration of the p-type anode region 8 and the p-type impurity concentration of the p-type base region 3 may be different from each other. Favorably, the p-type impurity concentration of the p-type anode region 8 is less than the p-type impurity concentration of the p-type base region 3. The amount of holes flowing from the p-type anode region 8 to the $n^-$-type base region 2 can be reduced thereby.

The characteristics of the semiconductor device 210 can be further increased by optimizing the existence or absence of the n-type barrier region, the Z-direction length and the like of the p-type semiconductor regions, the surface structure of the IGBT region R1, and the surface structure of the diode region R2.

Second Modification

Figure 17:
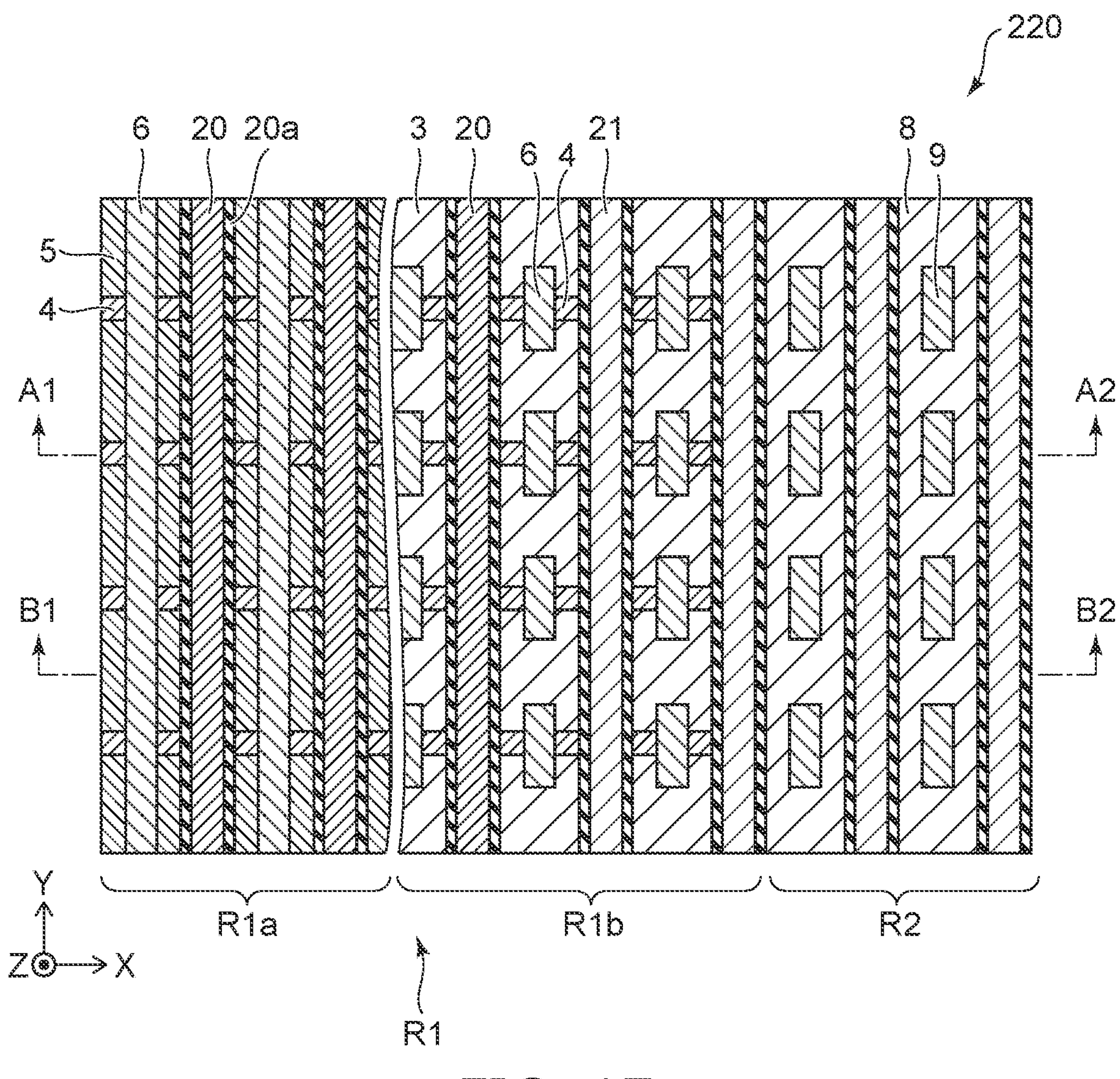
FIG. 17 is a cross-sectional view showing a portion of a semiconductor device according to a second modification of the second embodiment.
Figure 18:
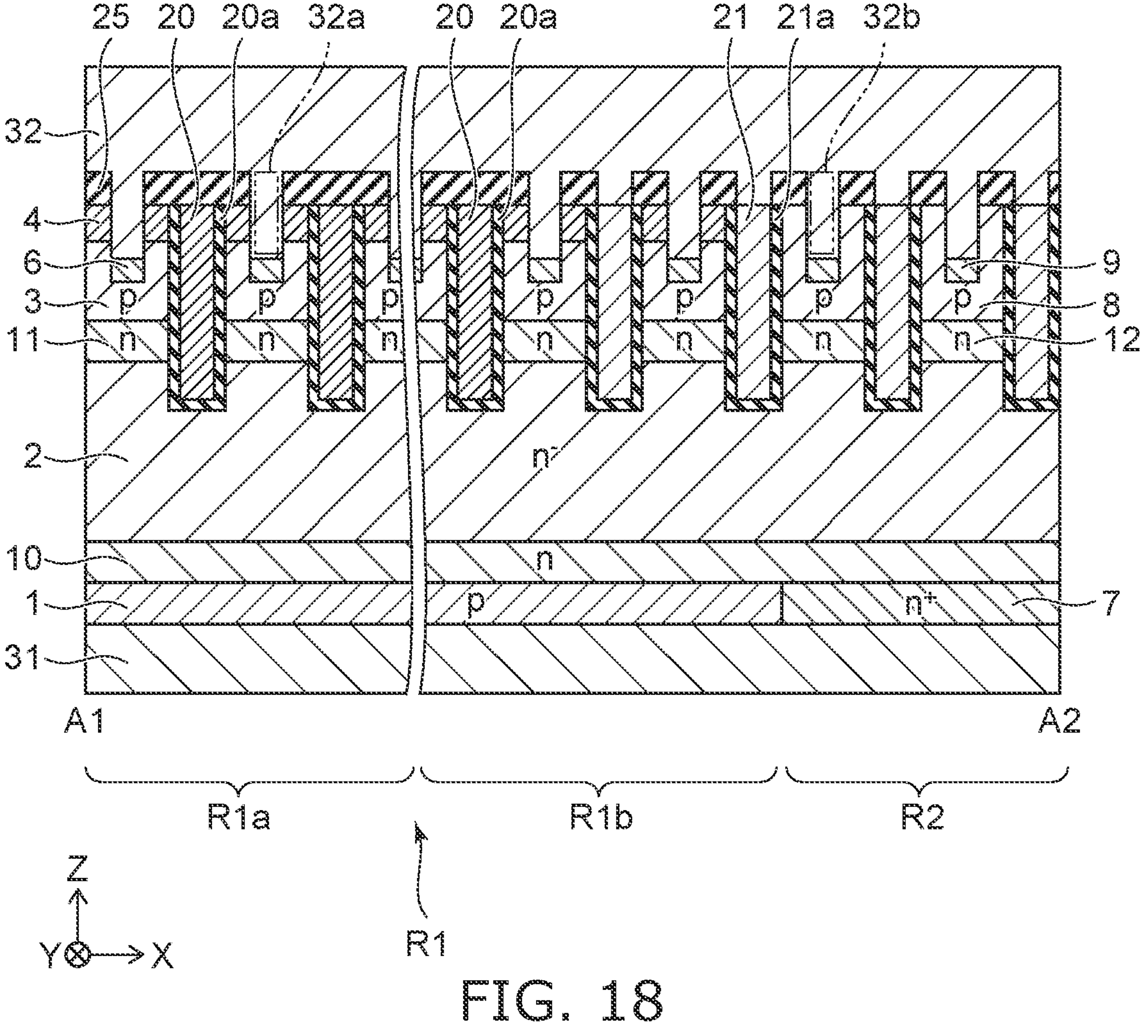
FIG. 18 is an A1-A2 cross-sectional view of FIG. 17.
Figure 19:
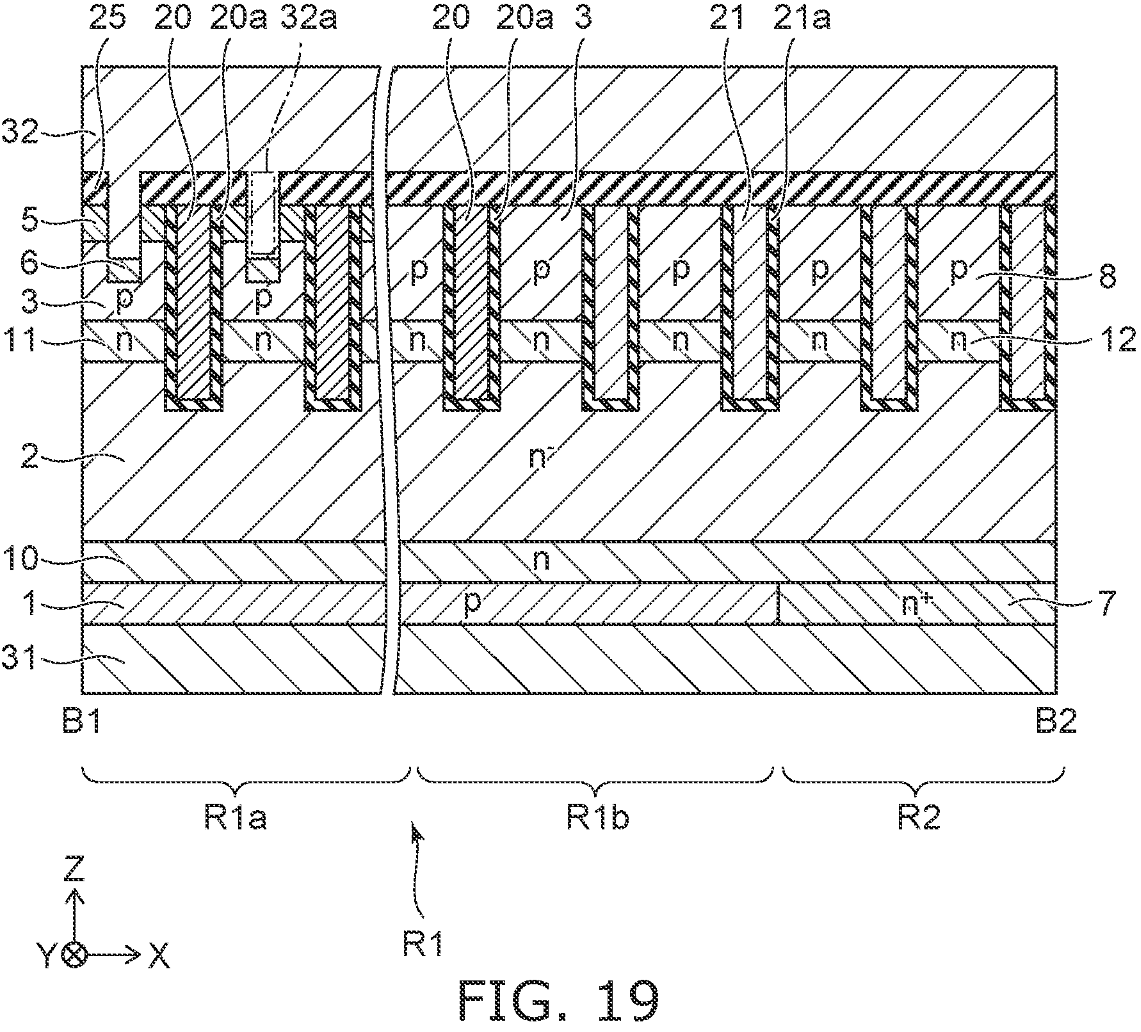
FIG. 19 is a B1-B2 cross-sectional view of FIG. 17.

FIG. 17 is a cross-sectional view showing a portion of a semiconductor device according to a second modification of the second embodiment. FIG. 18 is an A1-A2 cross-sectional view of FIG. 17. FIG. 19 is a B1-B2 cross-sectional view of FIG. 17.

The structure of the second part R1*b* of the semiconductor device 220 according to the second modification shown in FIGS. 17 to 19 is different from that of the semiconductor device 200. In the semiconductor device 220, multiple $p^+$-type contact regions 6 and multiple contact parts 32*a* are arranged in the Y-direction in the second part R1*b*. The multiple $p^+$-type contact regions 6 are separated from each other in the Y-direction. The multiple contact parts 32*a* are separated from each other in the Y-direction. A portion of the p-type base region 3 is located between the $p^+$-type contact regions 6 and between the contact parts 32*a*.

The $p^+$-type contact region 6 and the contact part 32*a* are located only in the region proximate to the $n^+$-type emitter region 4. For example, as shown in FIG. 18, the contact part 32*a* is positioned between a pair of $n^+$-type emitter regions 4 adjacent to each other in the X-direction. The $p^+$-type contact region 6 is positioned between the p-type base region 3 and the contact part 32*a* in the Z-direction.

When the parasitic diode of the IGBT region R1 operates, holes may flow not only from the $p^+$-type contact region 5 but also from the $p^+$-type contact region 6. In the semiconductor device 220, in the X-Y plane, the area of the $p^+$-type contact region 6 per unit area in the second part R1*b* is less than the area of the $p^+$-type contact region 6 per unit area in the first part R1*a*. Therefore, when the diode region R2 is in the on-state, the amount of holes flowing toward the $n^-$-type base region 2 via the $p^+$-type contact region 6 can be reduced. As a result, the operation of the diode region R2 can be faster, and the switching loss due to the operation of the diode region R2 can be reduced. The $p^+$-type contact region 6 and the contact part 32*a* are located in the region proximate to the $n^+$-type emitter region 4. Therefore, the increase of the potential in the region at the $n^+$-type emitter region 4 vicinity can be effectively suppressed.

According to the semiconductor device 220 according to the second modification, compared to the semiconductor device 200, the operation of the diode region R2 can be faster while suppressing the reduction of the latchup withstand capacity.

Embodiments of the invention include the following configurations.

Configuration 1

A semiconductor device, comprising:
- a first electrode;
- a second electrode separated from the first electrode;
- a first region located on a portion of the first electrode and positioned between the first electrode and the second electrode, the first region including
  - a first semiconductor region of a first conductivity type,
  - a second semiconductor region of a second conductivity type, a portion of the second semiconductor region being located on the first semiconductor region,
  - a third semiconductor region located on the portion of the second semiconductor region, the third semiconductor region being of the first conductivity type,
  - a gate electrode facing the third semiconductor region via a gate insulating layer in a second direction perpendicular to a first direction, the first direction being from the first electrode toward the second electrode,
  - a fourth semiconductor region located on the third semiconductor region and arranged with a portion of the second electrode in the second direction, the fourth semiconductor region being of the second conductivity type,
  - a fifth semiconductor region located between the fourth semiconductor region and a portion of the third semiconductor region in a third direction, the fifth semiconductor region being of the first conductivity type, the third direction being perpendicular to the first and second directions, the fifth semiconductor region being arranged with the portion of the second electrode in the second direction, a first-conductivity-type impurity concentration of the fifth semiconductor region being greater than a first-conductivity-type impurity concentration of the third semiconductor region, and
  - a sixth semiconductor region located between the third semiconductor region and the portion of the second electrode, the sixth semiconductor region being of the first conductivity type, a first-conductivity-type impurity concentration of the sixth semiconductor region being greater than the first-conductivity-type impurity concentration of the third semiconductor region; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, and an eighth semiconductor region located on the other portion of the second semiconductor region, the eighth semiconductor region being of the first conductivity type.

Configuration 2

The device according to Configuration 1, wherein the fourth semiconductor region is located between a pair of the fifth semiconductor regions in the third direction.

Configuration 3

The device according to Configuration 2, wherein the portion of the third semiconductor region is alternately arranged in the third direction with a group including the fourth semiconductor region and the pair of fifth semiconductor regions.

Configuration 4

The device according to any one of Configurations 1 to 3, wherein the first region includes a first part, and a second part positioned between the first part and the second region, the third semiconductor region, the fourth semiconductor region, the fifth semiconductor region, and the sixth semiconductor region each are located in the first part and in the second part, and a length in the third direction of the fifth semiconductor region located in the first part is greater than a length in the third direction of the fifth semiconductor region located in the second part.

Configuration 5

The device according to Configuration 4, wherein a plurality of the fifth semiconductor regions is arranged in the second direction in the second part, and lengths in the third direction of the plurality of fifth semiconductor regions decrease toward the second region.

Configuration 6

The device according to Configuration 4 or 5, wherein a length in the second direction of the second part is greater than a distance in the first direction between the first electrode and the second electrode.

Configuration 7

A semiconductor device, comprising:

a first electrode;

a second electrode separated from the first electrode;

a first region located on a portion of the first electrode and positioned between the first electrode and the second electrode, the first region including a first semiconductor region located in a first part of the first region and in a second part of the first region, the first semiconductor region being of a first conductivity type, a second semiconductor region of a second conductivity type, a portion of the second semiconductor region being located on the first semiconductor region, a third semiconductor region located in the first and second parts and positioned on the portion of the second semiconductor region, the third semiconductor region being of the first conductivity type, a gate electrode located in the first part, the gate electrode facing the third semiconductor region via a gate insulating layer in a second direction perpendicular to a first direction, the first direction being from the first electrode toward the second electrode, a fourth semiconductor region located in the first part and in the second part, the fourth semiconductor region being of the second conductivity type, the fourth semiconductor region being positioned on the third semiconductor region and arranged with a portion of the second electrode in the second direction, a fifth semiconductor region located in the first part, the fifth semiconductor region being of the first conductivity type, the fifth semiconductor region being arranged with the portion of the second electrode in the second direction, a first-conductivity-type impurity concentration of the fifth semiconductor region being greater than a first-conductivity-type impurity concentration of the third semiconductor region, and a sixth semiconductor region located in the first part and in the second part, the sixth semiconductor region being of the first conductivity type, the sixth semiconductor region being positioned between the third semiconductor region and the portion of the second electrode, a first-conductivity-type impurity concentration of the sixth semiconductor region being greater than the first-conductivity-type impurity concentration of the third semiconductor region, the fourth semiconductor region and the fifth semiconductor region being alternately arranged in a third direction in the first part, the fourth semiconductor region and a portion of the third semiconductor region being alternately arranged in the third direction in the second part, the third direction being perpendicular to the first and second directions; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, an eighth semiconductor region located on the other portion of the second semiconductor region, the eighth semiconductor region being of the first conductivity type, the second part being positioned between the first part and the second region.

Configuration 8

The device according to Configuration 7, wherein a length in the second direction of the second part is greater than a distance between the first electrode and the second electrode.

Configuration 9

The device according to Configuration 7 or 8, wherein a plurality of the sixth semiconductor regions is arranged in the third direction in the second part, and the plurality of sixth semiconductor regions is separated from each other.

Configuration 10

The device according to any one of Configurations 1 to 9, wherein a first-conductivity-type impurity concentration of the eighth semiconductor region is less than a first-conductivity-type impurity concentration of the third semiconductor region.

In the embodiments described above, the relative level of impurity concentration between the semiconductor regions can be confirmed by, for example, using SCM (Scanning Capacitance Microscope). The carrier concentration in each semiconductor region can be considered equal to the concentration of impurities activated in each semiconductor region. Accordingly, the relative level of the carrier concentration between the semiconductor regions can also be confirmed using the SCM. The impurity concentration in each semiconductor region can be measured by, for example, SIMS (Secondary Ion Mass Spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a second electrode separated from the first electrode;

a first region located on a portion of the first electrode and positioned between the first electrode and the second electrode, the first region including a first semiconductor region of a first conductivity type, a second semiconductor region of a second conductivity type, a portion of the second semiconductor region being located on the first semiconductor region, a third semiconductor region located on the portion of the second semiconductor region, the third semiconductor region being of the first conductivity type, a gate electrode facing the third semiconductor region via a gate insulating layer in a second direction perpendicular to a first direction, the first direction being from the first electrode toward the second electrode, a fourth semiconductor region located on the third semiconductor region and arranged with a portion of the second electrode in the second direction, the fourth semiconductor region being of the second conductivity type, a fifth semiconductor region located between the fourth semiconductor region and a portion of the third semiconductor region in a third direction, the fifth semiconductor region being of the first conductivity type, the third direction being perpendicular to the first and second directions, the fifth semiconductor region being arranged with the portion of the second electrode in the second direction, a first-conductivity-type impurity concentration of the fifth semiconductor region being greater than a first-conductivity-type impurity concentration of the third semiconductor region, and a sixth semiconductor region located between the third semiconductor region and the portion of the second electrode, the sixth semiconductor region being of the first conductivity type, a first-conductivity-type impurity concentration of the sixth semiconductor region being greater than the first-conductivity-type impurity concentration of the third semiconductor region; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, and an eighth semiconductor region located on the other portion of the second semiconductor region, the eighth semiconductor region being of the first conductivity type.

2. The device according to claim 1, wherein the fourth semiconductor region is located between a pair of the fifth semiconductor regions in the third direction.

3. The device according to claim 2, wherein the portion of the third semiconductor region is alternately arranged in the third direction with a group including the fourth semiconductor region and the pair of fifth semiconductor regions.

4. The device according to claim 1, wherein the first region includes a first part, and a second part positioned between the first part and the second region, the third semiconductor region, the fourth semiconductor region, the fifth semiconductor region, and the sixth semiconductor region each are located in the first part and in the second part, and a length in the third direction of the fifth semiconductor region located in the first part is greater than a length in the third direction of the fifth semiconductor region located in the second part.

5. The device according to claim 4, wherein a plurality of the fifth semiconductor regions is arranged in the second direction in the second part, and lengths in the third direction of the plurality of fifth semiconductor regions decrease toward the second region.

6. The device according to claim 4, wherein a length in the second direction of the second part is greater than a distance in the first direction between the first electrode and the second electrode.

7. The device according to claim 1, wherein a first-conductivity-type impurity concentration of the eighth semiconductor region is less than a first-conductivity-type impurity concentration of the third semiconductor region.

8. The device according to claim 1, wherein the fourth semiconductor region directly contacts both the portion of the second electrode and the gate insulating layer.

9. The device according to claim 1, wherein the fifth semiconductor region directly contacts both the portion of the second electrode and the gate insulating layer.

10. The device according to claim 1, wherein the fourth semiconductor region directly contacts the fifth semiconductor region in the third direction.

11. The device according to claim 1, wherein the third semiconductor region directly contacts the fifth semiconductor region in the third direction.

12. The device according to claim 2, wherein the fifth semiconductor region is located between a pair of the fourth semiconductor regions in the third direction, and the fifth semiconductor region directly contacts both of the pair of the fourth semiconductor regions.

13. A semiconductor device, comprising:

a first electrode;

a second electrode separated from the first electrode;

a first region located on a portion of the first electrode and positioned between the first electrode and the second electrode, the first region including a first semiconductor region located in a first part of the first region and in a second part of the first region, the first semiconductor region being of a first conductivity type, a second semiconductor region of a second conductivity type, a portion of the second semiconductor region being located on the first semiconductor region, a third semiconductor region located in the first and second parts and positioned on the portion of the second semiconductor region, the third semiconductor region being of the first conductivity type, a gate electrode located in the first part, the gate electrode facing the third semiconductor region via a gate insulating layer in a second direction perpendicular to a first direction, the first direction being from the first electrode toward the second electrode, a fourth semiconductor region located in the first part and in the second part, the fourth semiconductor region being of the second conductivity type, the fourth semiconductor region being positioned on the third semiconductor region and arranged with a portion of the second electrode in the second direction, a fifth semiconductor region located in the first part, the fifth semiconductor region being of the first conductivity type, the fifth semiconductor region being arranged with the portion of the second electrode in the second direction, a first-conductivity-type impurity concentration of the fifth semiconductor region being greater than a first-conductivity-type impurity concentration of the third semiconductor region, and a sixth semiconductor region located in the first part and in the second part, the sixth semiconductor region being of the first conductivity type, the sixth semiconductor region being positioned between the third semiconductor region and the portion of the second electrode, a first-conductivity-type impurity concentration of the sixth semiconductor region being greater than the first-conductivity-type impurity concentration of the third semiconductor region, the fourth semiconductor region and the fifth semiconductor region being alternately arranged in a third direction in the first part, the fourth semiconductor region and a portion of the third semiconductor region being alternately arranged in the third direction in the second part, the third direction being perpendicular to the first and second directions; and a second region located on an other portion of the first electrode and positioned between the first electrode and the second electrode, the second region including a seventh semiconductor region of the second conductivity type, the seventh semiconductor region having a higher second-conductivity-type impurity concentration than the second semiconductor region, an other portion of the second semiconductor region located on the seventh semiconductor region, an eighth semiconductor region located on the other portion of the second semiconductor region, the eighth semiconductor region being of the first conductivity type, the second part being positioned between the first part and the second region.

14. The device according to claim 13, wherein a length in the second direction of the second part is greater than a distance between the first electrode and the second electrode.

15. The device according to claim 13, wherein a plurality of the sixth semiconductor regions is arranged in the third direction in the second part, and the plurality of sixth semiconductor regions is separated from each other.

16. The device according to claim 13, wherein a first-conductivity-type impurity concentration of the eighth semiconductor region is less than a first-conductivity-type impurity concentration of the third semiconductor region.

17. The device according to claim 13, wherein the fourth semiconductor region directly contacts both the portion of the second electrode and the gate insulating layer.

18. The device according to claim 13, wherein the fifth semiconductor region directly contacts both the portion of the second electrode and the gate insulating layer.

19. The device according to claim 13, wherein the fourth semiconductor region located in the first part directly contacts the fifth semiconductor region in the third direction (Y).

20. The device according to claim 13, wherein the fourth semiconductor region located in the second part directly contacts the third semiconductor region in the third direction.

* * * * *